(12) United States Patent
Paradiso et al.

(10) Patent No.: US 12,247,332 B2
(45) Date of Patent: Mar. 11, 2025

(54) THREE-DIMENSIONAL MACHINE KNITTING OF ELECTRONIC TEXTILE FOR ACTIVITY RECOGNITION AND BIOMECHANICAL MONITORING

(71) Applicant: Massachusetts Institute of Technology, Cambridge, MA (US)

(72) Inventors: Joseph A. Paradiso, Medford, MA (US); Irmandy Wicaksono, Boston, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 82 days.

(21) Appl. No.: 18/311,527

(22) Filed: May 3, 2023

(65) Prior Publication Data
US 2023/0357967 A1 Nov. 9, 2023

Related U.S. Application Data

(60) Provisional application No. 63/337,625, filed on May 3, 2022.

(51) Int. Cl.
*D04B 15/66* (2006.01)
*D04B 1/16* (2006.01)
(Continued)

(52) U.S. Cl.
CPC .......... *D04B 15/66* (2013.01); *D04B 1/16* (2013.01); *D04B 1/24* (2013.01); *G06F 3/0416* (2013.01);
(Continued)

(58) Field of Classification Search
CPC ....... G06F 3/041; G06F 3/0414–04144; G06F 3/0416–04186; G06F 3/044–045; G06F 2203/04105
See application file for complete search history.

(56) References Cited

U.S. PATENT DOCUMENTS 8,766,925 B2* 7/2014 Perlin ................. G06F 3/0233
345/173
10,119,208 B2 11/2018 McMaster
(Continued)

OTHER PUBLICATIONS

Bamberg et al., "Gait Analysis Using a Shoe—Integrated Wireless Sensor System", IEEE Transactions on Information Technology in Biomedicine, vol. 12, No. 4, Jul. 2008; 12 pages.
(Continued)

*Primary Examiner* — Patrick F Marinelli
(74) *Attorney, Agent, or Firm* — DALY, CROWLEY, MOFFORD & DURKEE, LLP

(57) ABSTRACT

Disclosed herein are systems and techniques for seamless and scalable piezoresistive matrix-based intelligent textile development using digital flat-bed and circular knitting machines. Disclosed embodiments allow for combining and customizing functional conductive and polyester and spandex yarns, thus allowing for designing the aesthetics and architecting and engineering both the electrical and mechanical properties of the pressure sensing textile. In addition, by incorporating a melting fiber, disclosed embodiments allow for shaping and personalizing a three-dimensional piezoresistive fabric structure that can conform to the human body through thermoforming principles.

6 Claims, 17 Drawing Sheets

(51) Int. Cl.
    D04B 1/24      (2006.01)
    G06F 3/041     (2006.01)
    G06F 3/045     (2006.01)
    G06F 30/10     (2020.01)
(52) U.S. Cl.
    CPC .............. *G06F 3/045* (2013.01); *G06F 30/10* (2020.01); *D10B 2331/02* (2013.01); *D10B 2331/04* (2013.01); *D10B 2331/10* (2013.01); *D10B 2401/16* (2013.01); *D10B 2501/00* (2013.01); *G06F 3/04144* (2019.05); *G06F 2203/04105* (2013.01)

(56)            References Cited

U.S. PATENT DOCUMENTS

| | | | |
|---|---|---|---|
| 10,234,934 | B2 | 3/2019 | Connor |
| 10,401,241 | B2* | 9/2019 | Madden ............... G06F 3/04144 |
| 10,496,155 | B2* | 12/2019 | Schwarz ............ G02B 27/0093 |
| 12,130,982 | B2* | 10/2024 | Niu ...................... G06F 3/04164 |
| 2009/0256817 | A1* | 10/2009 | Perlin ................... G06F 3/0233 178/18.05 |
| 2014/0296749 | A1 | 10/2014 | Reid, Jr. et al. |
| 2016/0135744 | A1 | 5/2016 | Sarrafzadeh et al. |
| 2017/0356815 | A1* | 12/2017 | Madden ............... A61B 5/0205 |
| 2018/0217715 | A1* | 8/2018 | Cobanoglu ............. G01B 7/22 |
| 2022/0011892 | A1* | 1/2022 | Rosenberg ............ G06F 3/0447 |
| 2022/0214387 | A1* | 7/2022 | Thompson ................ G01L 1/18 |
| 2023/0357967 | A1* | 11/2023 | Paradiso ................. G06F 30/10 |
| 2024/0349834 | A1* | 10/2024 | Liu .......................... A41H 5/01 |

OTHER PUBLICATIONS

Wicaksono et al., "A tailored, electronic textile conformable suit for large-scale spatiotemporal physiological sensing in vivo", Nature Partner Journals, Flexible Electronics, Apr. 23, 2020; 13 pages.
Luo et al., "Learning human-environment interactions using conformal tactile textiles", Nature Electronics, vol. 4, Mar. 2021; pp. 193-201 (11 pages).
Yan et al., "Single fibre enables acoustic fabrics via nanometre-scale vibrations", Nature, vol. 603, Mar. 24, 2022; pp. 616-636 (21 pages).
Lundervold et al., "An overview of deep learning in medical imaging focusing on MRI", Z Med Phys 29, 2019; pp. 102-127 (26 pages).
Buechley et al., "Fabric PCBs, electronic sequins, and socket buttons: techniques for e-textile craft", Springer-Verlag London Limited, Aug. 22, 2007; pp. 133-150 (18 pages).
Yang et al., "Deep Convolutional Neural Networks on Multichannel Time Series For Human Activity Recognition", Institute for Infocomm Research; A*STAR, Jul. 25, 2015; 7 pages.
Wicaksono et al., "KnittedKeyboard: Digital Knitting of Electronic Textile Musical Controllers", Responsive Environments Group, MIT Media Lab, Jul. 21-25, 2020; pp. 323-326 (4 pages).
Bachus et al., "Measuring contact area, force, and pressure for bioengineering applications: Using Fuji Film and TekScan systems", Elsevier, Medical Engineering & Physics 28, 2006; pp. 483-488 (6 pages).
Li et al., "Stretchable Conductive Polypyrrole/Polyurethane (PPy/PU) Strain Sensor with Netlike Microcracks for Human Breath Detection", ACS Applied Materials & Interfaces, Dec. 26, 2013; pp. 1313-1319 (7 pages).
Chung et al., "Fabric-based Pressure Sensor Array for Decubitus Ulcer Monitoring", 35th Annual International Conference of the IEEE EMBS, Jul. 3-7, 2013; pp. 6506-6509 (4 pages).
Ou et al., "SensorKnit: Architecting Textile Sensors with Machine Knitting", 3D Printing and Additive Manufacturing, vol. 6, No. 1, 2019; 12 pages.
Weizman et al., "Sensor Array Design and Development of Smart Sensing System For Kick Force Visualization in Soccer", Elsevier, International Design Technology Conference, DesTech, Jun. 29-Jul. 1, 2015; pp. 138-143 (6 pages).
Leong et al., "proCover: Sensory Augmentation of Prosthetic Limbs Using Smart Textile Covers", University of Applied Sciences Upper Austria, Google Inc., Oct. 16-19, 2016; pp. 335-346 (12 pages).
Richardson et al., "Z-Tiles: Building Blocks for Modular, Pressure-Sensing Floorspaces", CHI 2004, Late Breaking Results Paper, Apr. 24-29, 2004; pp. 1529-1532 (4 pages).
Petz et al., "Performance Evaluation of Conductive Textiles for Movement Pattern Recognition in Smart Socks", The International Conference on Information and Digital Technologies, 2019; pp. 370-375 (6 pages).
Cheng et al., "Smart-surface: Large scale textile pressure sensor arrays for activity recognition", Pervasive and Mobile Computing, Elsevier, Jan. 7, 2016; 16 pages.
Meyer et al., "Design and Modeling of a Textile Pressure Sensor for Sitting Posture Classification", IEEE Sensors Journal, vol. 10, No. 8, Aug. 2010; pp. 1391-1398 (8 pages).
Zhu et al., "Efficient Human Activity Recognition Solving the Confusing Activities Via Deep Ensemble Learning", IEEE Access, Jun. 21, 2019; pp. 75490-75499 (10 pages).
Buscher et al., "Tactile dataglove with fabric-based sensors", 12th IEEE-RAS International Conference on Humanoid Robots, Nov. 29-Dec. 1, 2012; pp. 204-209 (6 pages).
Kim et al., "Single to Multi: Data-Driven High Resolution Calibration Method for Piezoresistive Sensor Array", IEEE Robotics and Automation Letters, vol. 6, No. 3, Jul. 2021; pp. 4970-4977 (8 pages).
Zhou et al., "The Carpet Knows: Identifying People in a Smart Environment from a Single Step", The First International Workshop on Pervasive Smart Living Spaces, 2017; 6 pages.
Wicaksono et al., "FabricKeyboard: Multimodal Textile Sensate Media as an Expressive and Deformable Musical Interface", ResearchGate, Conference Paper, May 2017; 7 pages.
Wicaksono et al., "Electronic Textile Gaia: Ubiquitous Computational Substrates Across Geometric Scales", IEEE Pervasive Computing, Computational Materials, Jul.-Sep. 2021, Jul. 30, 2021; pp. 18-29 (12 pages).
Parzer et al., "RESi: A Highly Flexible, Pressure-Sensitive, Imperceptible Textile Interface Based on Resistive Yarns", UIST 2018, Session 14: Novel Haptics, Oct. 14-17, 2018; pp. 745-756 (12 pages).
Wicaksono et al., "SensorNets: Towards Reconfigurable Multifunctional Fine-grained Soft and Stretchable Electronic Skins", CHI 2020 Extended Abstracts, Apr. 25-30, 2020; 8 pages.
Baldoli et al., "Pressure mapping with textile sensors for compression therapy monitoring", Journal of Engineering in Medicine 2016, vol. 230(8), May 23, 2016; pp. 795-808 (14 pages).
Parzer et al., "SmartSleeve: Real-time Sensing of Surface and Deformation Gestures on Flexible, Interactive Textiles, using a Hybrid Gesture Detection Pipeline", UIST 2017, Session: Phones & Watches, Oct. 22- 25, 2017; pp. 565-577 (13 pages).
Jeong et al., "Wearable Respiratory Rate Monitoring using Piezoresistive Fabric Sensor", IFMBE Proceedings vol. 25, 2009; pp. 282-284 (3 pages).
Roh et al., "Robust and Reliable Fabric, Piezoresistive Multitouch Sensing Surfaces for Musical Controllers", Proceedings of the International Conference on New Interfaces for Musical Expression, May 30-Jun. 1, 2011; pp. 393-398 (6 pages).
Cherston et al., "SpaceSkin: development of aerospace-grade electronic textile for simultaneous protection and high velocity impact characterization", Proceedings of SPIE vol. 10970, Sensors and Smart Structures Technologies for Civil, Mechanical, and Aerospace Systems, Mar. 27, 2019; 16 pages.

* cited by examiner

THREE-DIMENSIONAL MACHINE KNITTING OF ELECTRONIC TEXTILE FOR ACTIVITY RECOGNITION AND BIOMECHANICAL MONITORING

CROSS-REFERENCE TO RELATED APPLICATIONS

This application claims the benefit under 35 U.S.C. § 119 of U.S. Provisional Patent Application No. 63/337,625 filed on May 3, 2022, which is hereby incorporated by reference herein in its entirety.

BACKGROUND

Current efforts in functional and electronic textiles focus on the coating, screen-printing, embedding or attachment of electronic devices on fabrics. These manual and hand-made approaches, even though they have certain values in some aspects, restrain researchers and designers from rapid prototyping, large-scale manufacturing, and translation of electronic textiles. Recently, advances in mechatronics, digital fabrication, and computer-aided design have revolutionized the concept of three-dimensional (3D) knitting with computerized knitting machines (sometimes referred to as a computer numerical control, CNC, knitting machine). These machines enable users to customize their textile patterns and structures through a specialized visual programming environment and various types of yarn.

SUMMARY

Disclosed herein are systems and techniques that leverage digital knitting techniques using flat-bed and circular knitting machines with thermoforming techniques to realize a set of 2D to 3D piezoresistive matrix textile mats and wearables that are able to detect multipoint pressure across their surfaces in real-time. Various functional and common fiber choices and knitting structures may be used to impact various parameters, including interconnect resistance, matrix resolution, pressure sensitivity, and the fabric visual and mechanical properties through functional and common fiber choices and knitting structures.

The present disclosure is motivated by the fact that most of our physical gestures and interactions involve contacts between different parts of our body and a surface. As we perform our daily activities such as walking, exercising, sitting, or sleeping, a characteristic spatiotemporal contact and pressure pattern can be monitored and identified from sensing the floor or the fabrics in our interiors or bedsheets. Accordingly, this disclosure provides for a knitted piezoresistive textile matrix for tracking and recognizing activities and exercises. Disclosed systems and techniques allow for personalizing textile wearables such that they are form-fitting and conformable and result in accurate and robust sensing while ensuring comfortability. Moreover, they allow rapid, large-scale manufacturing of electronic textiles with vast aesthetic and functional design choices. Disclosed systems and techniques may allow for monitoring biomechanical forces with high accuracy, repeatability, and comfortability through wearables or sensing surfaces.

There are two common methods of pressure sensing in electronic textiles: capacitive and resistive-based. The capacitive approach consists of a spacer fabric in between two conductive layers. Prior work has used a textile insulator in-between a bottom common electrode fabric and an embroidered array of electrodes as a top fabric for activity detection, specifically to recognize sitting postures. The spacer was chosen to be squishy to improve comfortability of the pressure sensor. Resistive sensing leverages a piezoresistive element in the form of yarn or fabric as a middle layer in between two conductive elements. The resistance of the piezoresistive element changes as a force is exerted due to the bridging of conductive particles. A cross-configuration of piezoresistive sensing textile, which employs conductive top and bottom matrix lines, allows distributed 2D pressure sensing across the fabric. Several other efforts also integrated piezoelectric materials in threads or textiles to detect vibration. Since piezoelectric material can also be used as an energy harvester, this technique has the capability to be self-powered in certain applications. However, piezoelectrics do not measure pressure continuously, and have to be continuously integrated or only work as a dynamic pressure or impact detector.

Piezoresistive materials have been explored in many ways as pressure sensing textiles, especially in the realm of human-computer interaction (HCI), sports, and medical science. In HCI, they have been used as to provide 2D tactile input, for example in musical and multimedia interfaces, as well as deformation sensing in the form of a sleeve for fabric-based gestural interaction. Past works have also explored the use of 2D pressure-sensing textiles integrated as a mat, glove, or clothing for object and human activity, gesture, or posture recognition. Our work has analyzed the subtle pressure distribution change across the fabrics throughout the activity, and applied machine learning principles for feature extraction and classification. Piezoresistive textiles have also been used in rehabilitation and medical applications, such as for gait analysis and detection, respiration sensing, pressure ulcer monitoring and prevention, and compression therapy. Specifically, due to its breathable, soft, and comfortable nature compared to non-textile flexible pressure-sensing grids, research has been conducted in augmenting prosthetic covers, linings, or even robotic skin with piezoresistive textiles.

Presented herein is a general approach to develop seamless and 3D pressure-sensitive electronic textiles using whole-garment and circular knitting machines. This disclosure allows for combining and customizing functional and common yarns, thus allowing for designing the aesthetics while architecting and engineering both the electrical and mechanical properties of the sensing textile. Further, by engineering the loop knit structures and incorporating a melting fiber, the disclosed techniques allow for shaping and personalizing a 3D electronic textile that can adapt and conform to curved, dynamic surfaces (e.g., parts of the human body) through thermoforming principles.

Aspects of the present disclosure include textile design, fabrication techniques, 3D thermoforming techniques, resistive matrix sensing array circuits, wireless hardware systems, applications of deep-learning to 3D pressure sensor images, and deep-learning enabled recognition methods. Systems and techniques described herein enable the fabrication of 2 to 3D pressure-sensitive textile interiors and wearables, including an intelligent mat, sock, and shoe that can be used for a variety of applications ranging from rehabilitation, sport science, prosthetics, robotics, to gaming interfaces.

Other knitted e-textiles mostly rely on capacitive modalities or conductive electrodes that only allow single or discrete multiple sensing locations instead of a 3D distributed sensing matrix. In contrast, the general approach described herein utilizes 3D knitting with computerized knitting machines and intrinsically conductive and functional fibers and fabrics. These rapid and additive manufacturing machines enable users to personalize, design, and fabricate their textile patterns, structures, and form-factors (e.g., sleeves, socks, shoes, apparels) based on their forms and choices through a specialized visual programming environment and various types of functional and non-functional fibers and yarns. Knitted textiles also possess desirable qualities as they are more breathable and stretchable than other textiles.

It is appreciated herein that, without thermoforming or stiffening, there is a significant hysteresis response when a piezoresistive textile sensor is compressed and relaxed, as there are volume gaps and discontinuities between each layer that can cause textile sagging and sensor drift. Systems and techniques described herein allow for the manufacture of a thermoformed textile, combined with a robust sensing array circuit. This approach can significantly reduce noise, ghosting, and hysteresis while providing reliable performance during cyclic compression and real-scenario testing, as well as provide the possibility of making a semi-rigid 3D sensate structure.

According to one aspect of the disclosure, a method for developing 3D-knitted electronic textile includes: specifying a program for a computerized knitting machine, the program specifying a shape and pattern for the textile and different combinations of yarns to be used for different portions of the pattern, wherein the yarns include one or more functional yarns for electronic sensing or thermoforming and one or more non-functional yarns for insulation and aesthetics; and providing the program as input to the computerized knitting machine to develop the 3D-knitted electronic textile (e.g., a sleeve, shoe, sock, etc.).

In some embodiments, the one or more functional yarns can include a conductive yarn, resistive yarn, a yarn with resistance that can change with temperature/humidity/strain/etc., a piezoresistive yarn, a low-melt or thermoplastic polyurethane (TPU) yarn, or some combination thereof. In some cases, at least two different functional yarns may be used. In some embodiments, the one or more non-functional yarns can include polyester, spandex, cotton, silk, or some combination thereof. In some embodiments, the pattern specified for the textile may include conductive and non-conductive elements (e.g., alternating conductive and non-conductive strips).

In some embodiments, the computerized knitting machine can include a flat-bed knitting machine. In other embodiments, a circular knitting machine may be used.

In some embodiments, wherein the functional yarns include at least one low-melt or thermoplastic polyurethane (TPU) yarn, the method can further include: generating a 3D scan of an object (e.g., a part of a human body, a part of a non-human machine or apparatus, etc.); printing a 3D model of the object using the 3D scan; and heating the bonding/melting fibers to thermoform the knitted electronic textile over the 3D model of the object.

According to a further aspect of the disclosure, another method can include: computer knitting two conductive textile layers each having conductive and non-conductive elements; and arranging the two conductive textile layers such that the conductive elements of one intersect with the conductive elements of the other, with the intersecting elements being separated by piezoresistive material. In some embodiments, the other method can further include computer knitting the piezoresistive material as a textile layer, wherein the textile layer is arranged between the two conductive textile layers. In some embodiments, the other method can include developing the piezoresistive material by coating polyester yarn or knit fabric with a conducting polymer. In some embodiments, the other method may further include intrinsically knitting the piezoresistive material between the two conductive textile layers with piezoresistive fibers as an integral spacer layer.

According to a further aspect of the disclosure, a system may be provided for use with a knitted textile having a plurality of pressure sensing points. The system can include: a plurality of column lines connected to the textile and a first multiplexer; a plurality of row lines connected to the textile and a second multiplexer; and one or more digital circuits. The digital circuits are control the first multiplexer to periodically switch a voltage supply to each of the plurality of column lines while putting the rest of the column lines on high-impedance, and control the second multiplexer to sequentially connect to ones of the plurality of row lines to a potential divider while grounding the other row lines for reading out values of the plurality of pressure sensing points.

In some embodiments, the one or more digital circuits comprise a shift register arranged to control the second multiplexer. In some embodiments, the one or more digital circuits can include a processor configured to control the first multiplexer. In some embodiments, the processor may be further configured to wirelessly transmit the values of the plurality of pressure sensing points to a remote processing system. The remote can be configured to generate one or more pressure heat-maps based on the values of the plurality of pressure sensing points, and to use the heat-maps to recognize activities of a wearer using machine learning (ML). In some embodiments, the pressure heat-maps can be images having 2D arrays of pixels, wherein the remote processing system is configured to recognize the activities of the wearer by providing the images as input to a Convolutional Neural Network (CNN) trained to classify human activities.

It should be appreciated that individual elements of different embodiments described herein may be combined to form other embodiments not specifically set forth above. Various elements, which are described in the context of a single embodiment, may also be provided separately or in any suitable sub-combination. It should also be appreciated that other embodiments not specifically described herein are also within the scope of the following claims.

BRIEF DESCRIPTION OF THE DRAWINGS

The manner of making and using the disclosed subject matter may be appreciated by reference to the detailed description in connection with the drawings, in which like reference numerals identify like elements.

The drawings are not necessarily to scale, or inclusive of all elements of a system, emphasis instead generally being placed upon illustrating the concepts, structures, and techniques sought to be protected herein.

DETAILED DESCRIPTION

Figure 1B:
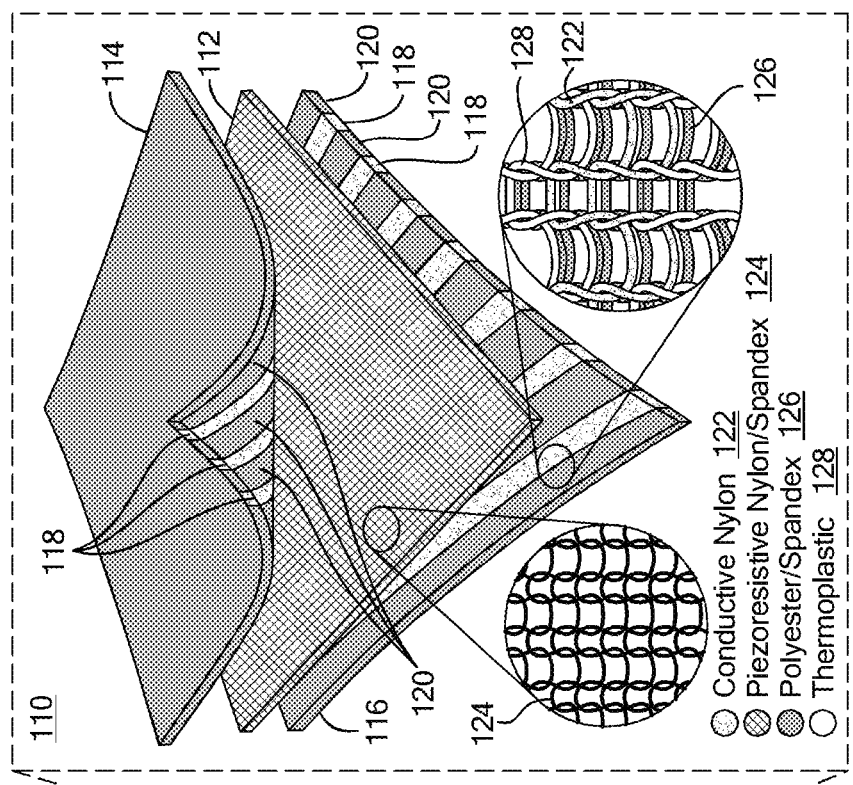
FIG. 1B shows a multi-layer structure of pressure-sensitive textiles that may be provided according to embodiments of the present disclosure.
Figure 1A:
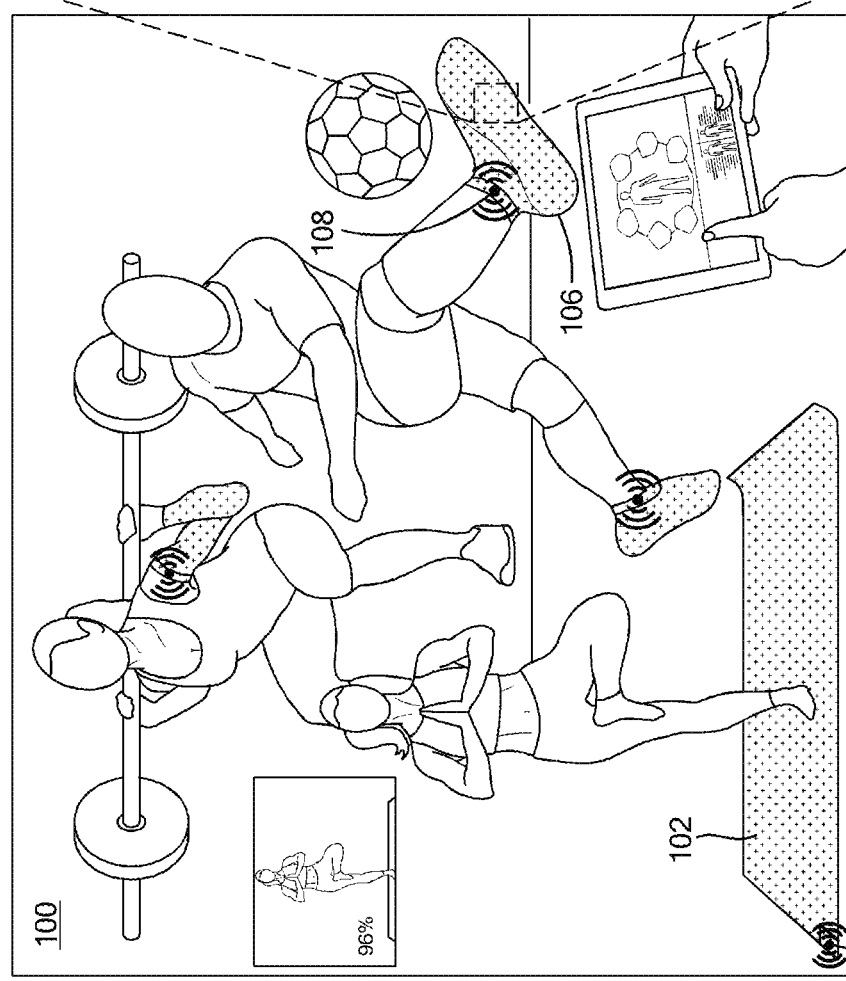
FIG. 1A illustrates 3D-knitted wireless intelligent textile for sport biomechanics, according to embodiments of the present disclosure.

Referring to FIG. 1A, physical gestures and interactions can involve contacts between different parts of a person's body and a surface. As a person performs daily activities such as walking, exercising, or sleeping, a characteristic spatiotemporal contact and pressure pattern can be monitored and identified from sensing surfaces and wearables provided according to embodiments of the present disclosure. For example, a yoga mat 102 formed of electronic textile (or "e-textile") can be used to monitor and identify different yoga poses. As another example, a shoe 106 having one or more surfaces formed of e-textile can be used to monitor and identify various exercises.

E-textile objects 102 and 106 can be electrically connected (e.g., via wires) to processing systems 104 and 108, respectively. In some cases, processing systems 104, 108 may be integrated within or attached to the e-textile objects 102, 106. When contact is made, e-textile objects 102, 106 generate electrical response which is read out by the processing systems 104, 108 to detect multipoint pressure across their surfaces.

In some cases, the "local" processing systems 104, 108 can transmit the detection information to a remote processing system (e.g., a smartphone, tablet, laptop, or cloud-based server) for activity recognition, biomechanical monitoring, or other advanced processing. In other cases, some or all such advanced processing may be performed by the local processing systems 104, 108. In some cases, local processing systems 104, 108 may include radios for wirelessly transferring data to a remote processing system. In some cases, deep learning techniques may be used for activity recognition, biomechanical monitoring, or other advanced processing. Additional details on the structure and operation of such processing systems are provided below.

Referring to FIG. 1B, according to some embodiments, sensorized surfaces and wearables may be formed from a multi-layer structure 110 of pressure-sensitive textiles. Illustrative structure 110 comprises a piezoresistive layer 112 that is positioned ("sandwiched") in between two outer layers 114, 116, as shown. Outer layers 114, 116 may sometimes be referred to as conductive layers.

As shown, outer layers 114, 116 may be machine-knitted (e.g., with a with digital flat-bed knitting machine) using a combination of yarn materials (or "fibers"), namely conductive 122, polyester/spandex 126, and low-melt or thermoplastic polyurethane yarns 128. Yarns that allow for electronic sensing and/or thermoforming are referred to herein as "functional yarns." Yarns that used for insulation, aesthetics, bulk material, or other purposes other than electronic sensing and thermoforming are referred to herein as "non-functional yarns." Non-limiting examples of functional yarns include conductive yarn, piezoresistive yarn, low-melt or TPU yarn, resistive yarn, and yarn with resistance that can change with temperature, humidity, strain, or another quantity. Non-limiting examples of non-functional yarns include polyester, spandex, cotton, and silk.

Both outer layers 114, 116 may designed and knit to have a plurality of conductive elements (or "strips" or "lines") 118 separated by non-conductive elements 120. To promote clarity in the figure, only a few such elements are labeled in the figure. Conductive lines 118 may be knit from one or more conductive fibers or, in some cases, a combination of conductive and non-conductive fibers. Non-conductive elements 120 can be knit from one or more non-conductive fibers, such as polyester, spandex, nylon, cotton, silk, or any other non-conductive/insulating yarn. For example, as shown in FIG. 1B, conductive lines 118 may be knit in a polyester base using conductive 122, possibly combined with polyester/spandex 126 and/or thermoplastic 128, whereas non-conductive elements 120 may be formed using the polyester/spandex 126 possibly in combination with thermoplastic 128 yarns.

The outer layers 114, 116 may be formed such that they are completely insulated on one side (all-polyester) and partly conductive on the other side (sequence of conductive lines in a polyester base). That is, conductive lines 118 may be formed on one side of an outer layer but not on the other, as shown in FIG. 1B. To achieve this, two layers may be blended together into one textile layer using a knitting machine that has two or four-layer beds and a knitting interlocks mechanism. This is useful, since insulating the outer layers 114, 116 can suppress parasitic contact impedance and signals introduced from the environment. Polyester can be mixed with bonding yarns to ensure multi-layer adhesion and prevent sensor drift from motion artifacts.

The conductive lines on one outer layer 114 may be arranged orthogonal to those on the other outer layer 116 to form a 2D conductive matrix. The term "matrix" is broadly used herein to describe an arrangement having a first set of lines which intersect with a second set of lines (in some cases each of the first set intersecting with each of the second set). While FIG. 1B shows a matrix with orthogonal conductive lines, the techniques and structures disclosed herein can be used to produce pressure-sensitive 3D knitted textiles having non-orthogonal conductive lines, such as curved lines. Further, the "matrix" lines may not be evenly spaced across the surface of a textile, but rather distributed based on desired sensing resolution at various areas of interest ("dynamic areas").

Piezoresistive layer 112 exploits the piezoresistive effect, where mechanical pressure applied to the material induces a change of its electrical resistance, which can be read out via the conductive matrix formed by outer layers 114, 116. Piezoresistive layer 112 may be knit from a piezoresistive nylon/spandex 124, as shown. The piezoresistive material may be developed by coating a non-conductive yarn or fabric with conducting polymer. As one example, the piezoresistive material may be developed by coating polyester knit fabric with conducting polymer polypyrrole (PPy).

Layers 112, 114, 116 can be fused together through intrinsically knitted bonding yarns.

FIG. 1B shows an example where the piezoresistive layer is separate from the outer layers. In other examples, piezoresistive yarns may be knitted within one or more of the outer layers as an integral spacer layer, acting as the pressure-sensitive element.

Figure 1C:
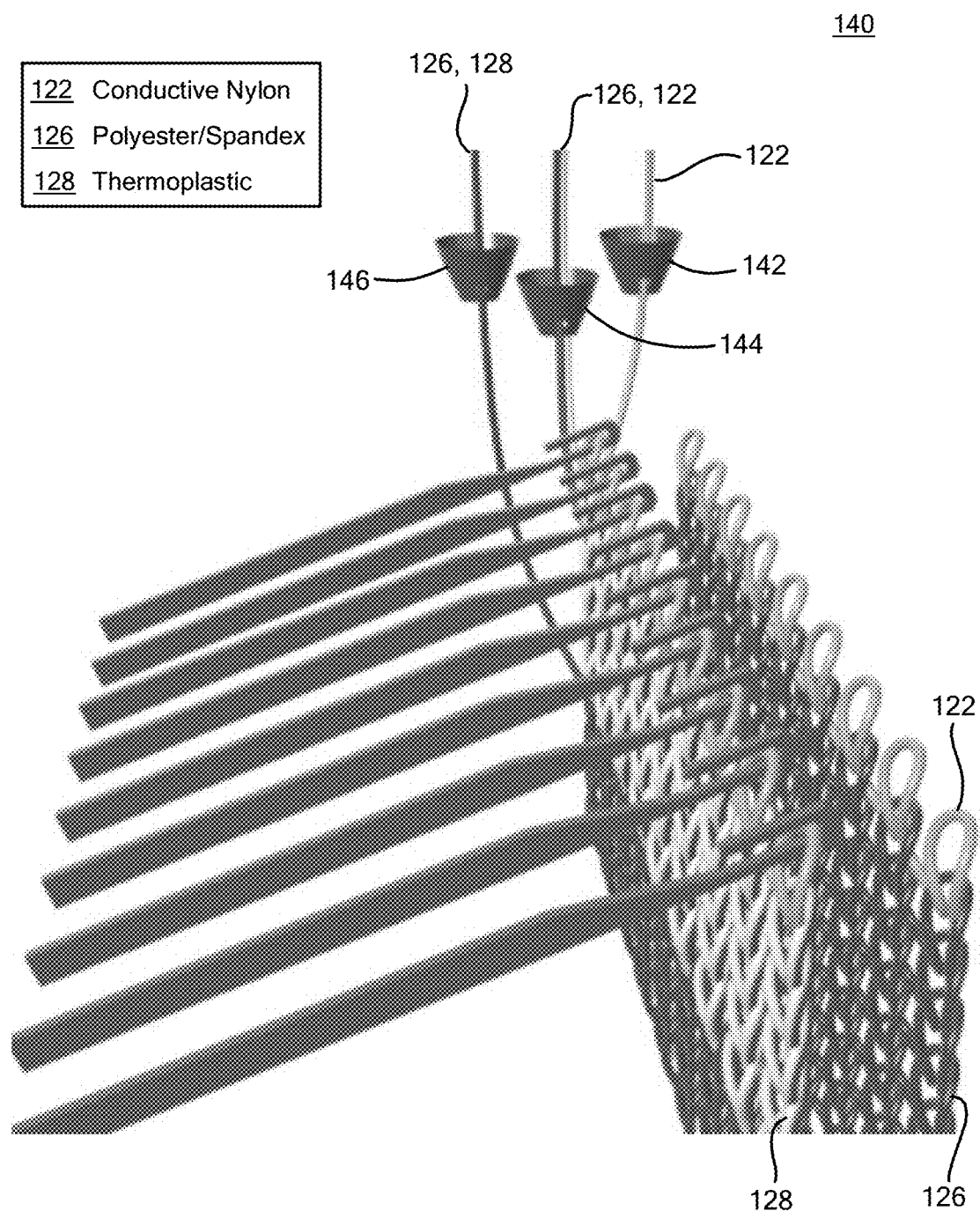
FIG. 1C illustrates a flat-bed knitting structure that may be used within a pressure-sensitive textile, according to some embodiments.

FIG. 1C shows a flat-bed knitting structure 140 that can be used to form e-textile layers, according to some embodiments. For example, structure 140 may be used to form outer layers 114, 116 shown in FIG. 1B. The illustrative flat-bed knitting structure 140 has three yarn carriers, with a first yarn carrier 142 providing conductive 122, a second yarn carrier 144 providing a twisted composite of polyester/spandex 126 and conductive 122, and a third yarn carrier 146 providing a twisted composite of polyester/spandex 126 and conductive 122 and thermoplastic 128. The number and type of yarn carriers shown in FIG. 1C is just one example. For example, as previously discussed, piezoresistive yarns may be knitted along with the yarns shown in FIG. 1C to produce an "outer" layer that also acts as the pressure-sensitive element.

FIG. 1C shows an example of flat-bed knitting which may be suitable for producing flat textile surfaces. In other cases, a circular knitting machine may be used to produce tubular knitted conductive textiles. The general structures and techniques sought to be protected herein are not limited to any particular type of knitting machine or knitting process.

Figure 2:
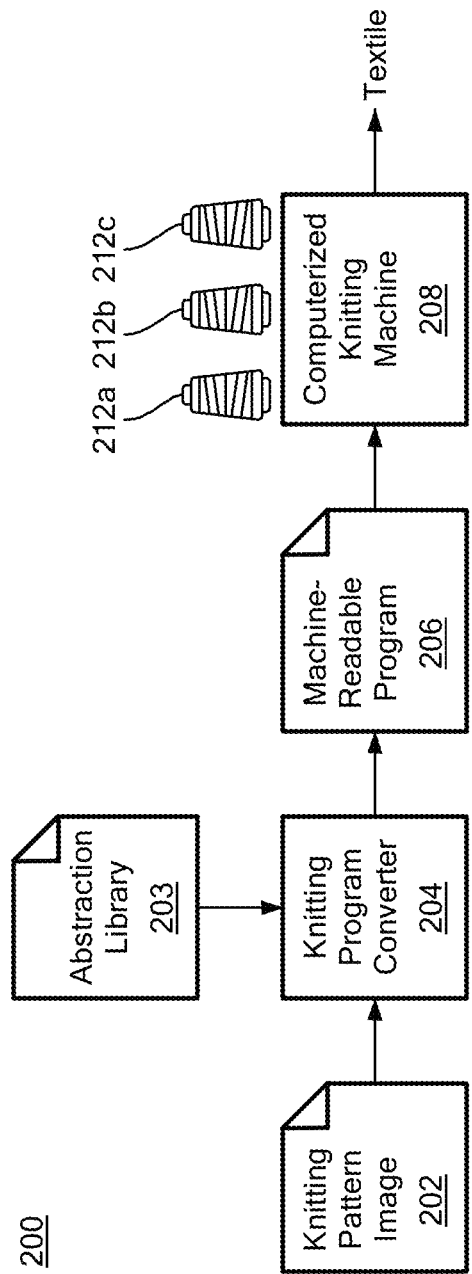
FIG. 2 shows a process for fabricating a pressure-sensitive textile wearable using a computerized knitting machine, according to some embodiments.

FIG. 2 shows a process 200 for fabricating a pressure-sensitive textile wearable using a computerized (CNC) knitting machine 208, according to some embodiments. A knitting pattern image 202, received as input (e.g., a computer file), specifies and represents the shape and pattern of a final knit fabric. In some cases, a user may create a knitting pattern image 202 using a graphical user interface (GUI). The knitting pattern image 202 may be automatically converted into a machine-readable program 206 by conversion software 204. Conversion software 204 may also receive as input or otherwise access an abstraction library 203 specifying knitting machine parameters such as the yarn carrier number, knitting speed, and stitch tension to be used for different parts of the pattern. The machine-readable program 206 has a low-level format understood by computerized knitting machine 208 and can include back-and-forth knitting patterns and instructions for using different yarn carriers 212a, 212b, 212c, etc. Using program 206, Process 200 may be used to readily design the aesthetics and architect and engineer both the electrical and mechanical properties of pressure sensing textiles, including e-textiles for activity recognition and biomechanical monitoring.

Figure 2A:
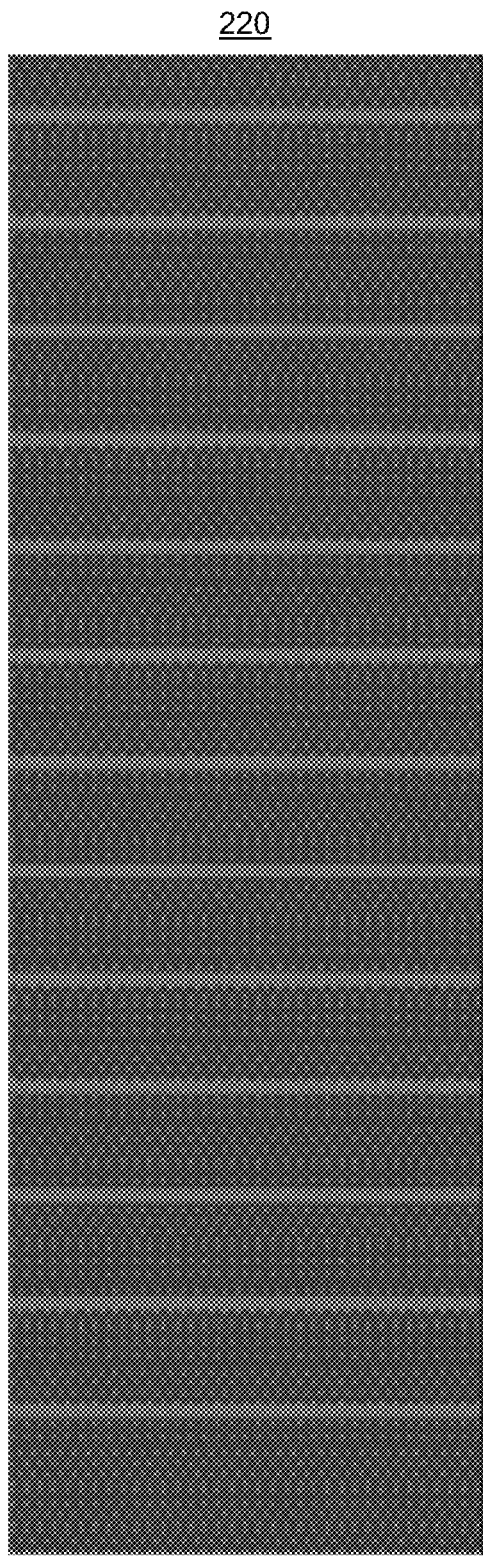
FIGS. 2A and 2B show examples of a knitting pattern image and abstraction library, respectively, that may be provided as input to the process of FIG. 2.
Figure 2B:
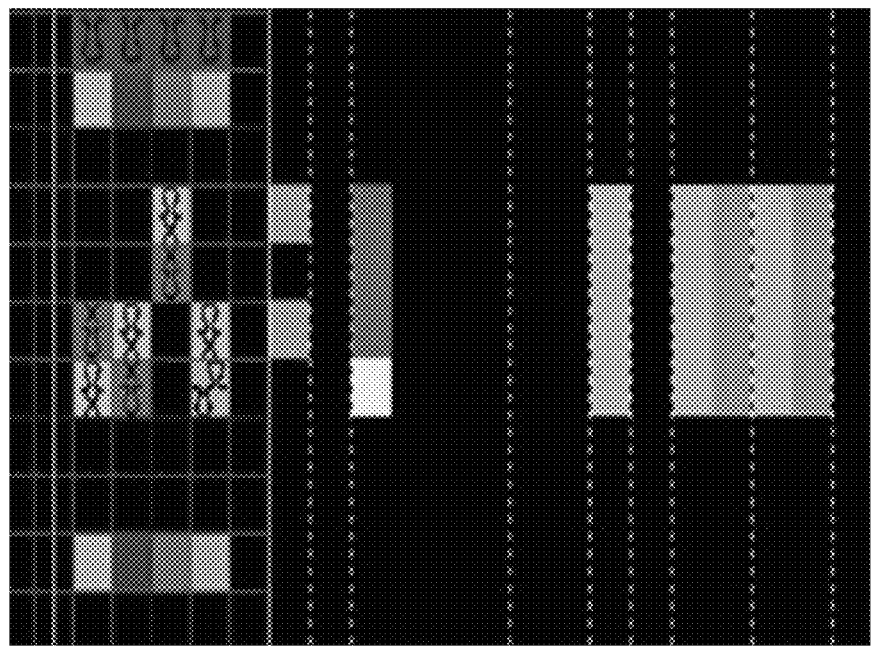

FIGS. 2A and 2B respectively show examples of a knitting pattern image 220 and abstraction library 240 that may be provided as input to the process of FIG. 2. FIG. 2A shows an example of a textile pattern with 13 conductive transmission lines.

Figure 2C:
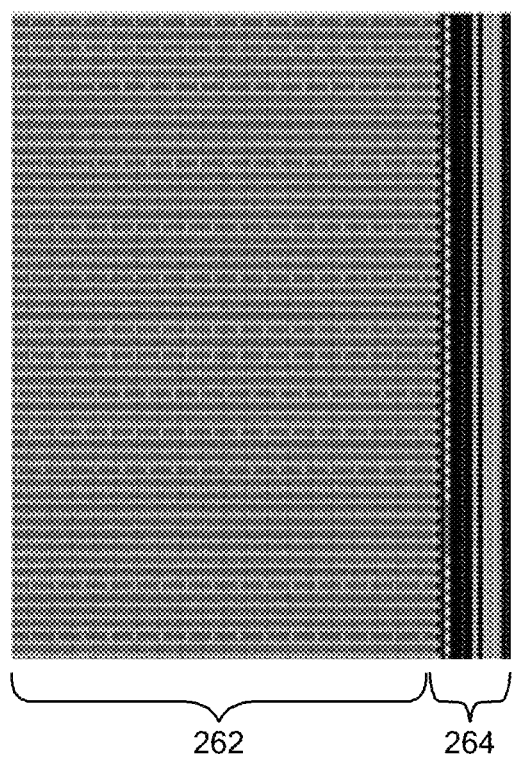
FIG. 2C shows an example of machine-readable program format that may generated by the process of FIG. 2.

FIG. 2C shows an example of machine-readable program 260 format that may generated from the inputs of FIGS. 2A and 2B, starting with low-level color block-programming that enables abstraction and simplification from a knitting machine-readable instruction format.

As shown, a digital knitting programming interface can include two grid areas 262 and 264. A first grid area 262 is used to develop the shape and pattern of the knit fabrics through x-y color block programming, where each color and sign represents a specific knit instruction. (In FIGS. 2A-C, "colors" are represented by different grey tones and/or black-and-white fill patterns.) A second grid area 264 defines machine parameters for each line such as the yarn carrier number, knitting speed, and stitch tension. Each "color" on the first grid 262 represents a different knit operation, such as knit, tuck, transfer, and skip. In the case where a flat-bed knitting machine with two machine beds is used, most of the operations involve switching from the front to the back knit.

Program 260 represents line-to-line front and back knit instructions for the computerized knitting machine. Each color can be mapped to a specific yarn carrier to provide various yarns, such as conductive, piezoresistive, and non-conductive yarns (including insulating or melting yarns) or any combination thereof. As one example, conductive lines are mapped into front-knit (polyester yarn carrier) and back-knit (conductive yarn carrier). The final instruction consists of back-and-forth knitting patterns with different yarn carriers, as instructed. Every two lines here (front and back knit) represent one loop row or course of the fabric. The machine scans through each line of instructions until the end of the file.

Figure 3A:
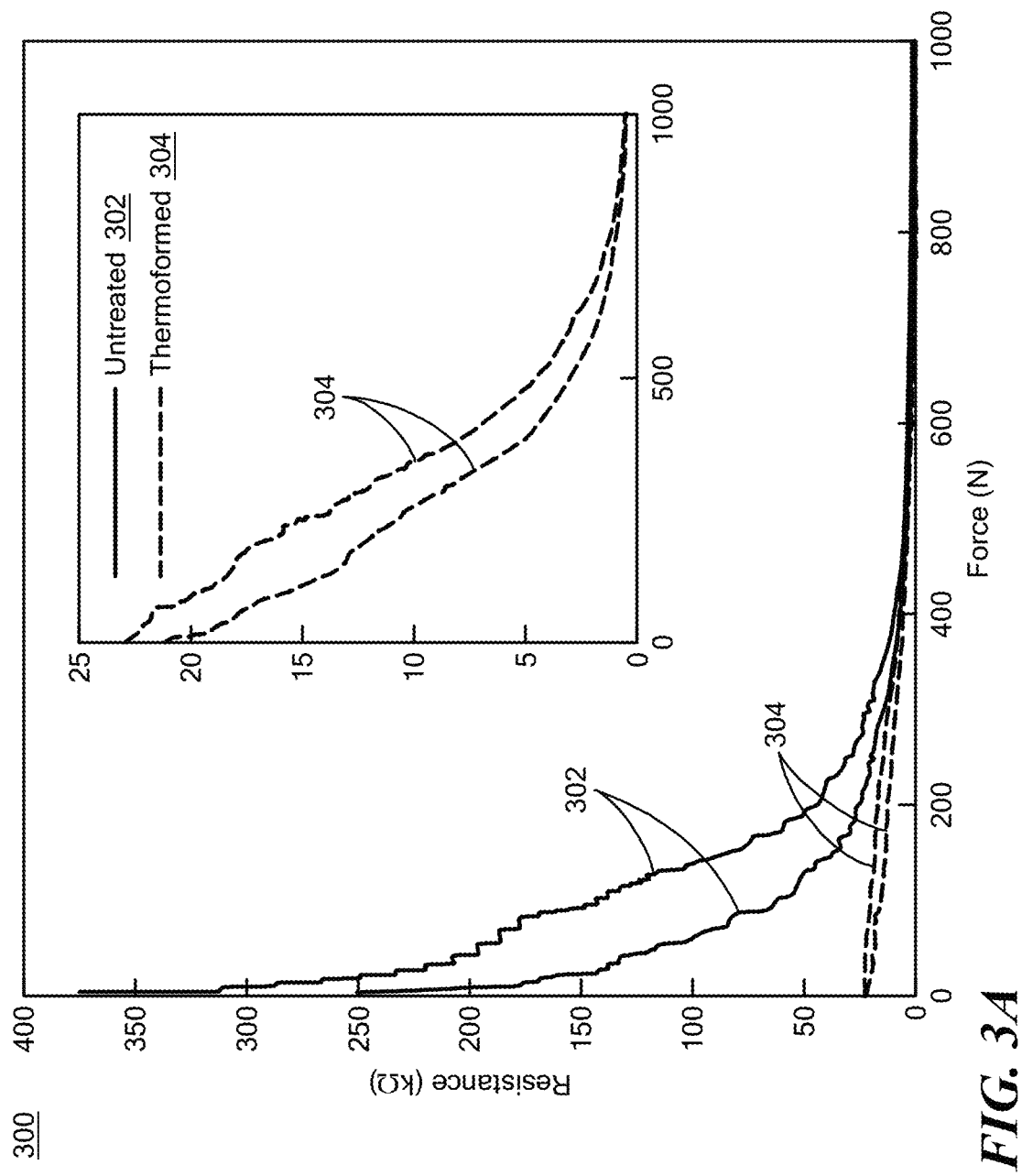
FIG. 3A is a graph showing a force vs resistance characterization of different multi-layer piezoresistive knit textiles that may be provided according to embodiments of the present disclosure.

Turning to FIG. 3A, the relationship between force and resistance of knitted textile sensors, according to the present disclosure, can be compared. For example, mechanical and electrical characterization with a tensile and compression testing unit (Zwick BTC-EXMACRO, Roell) and custom resistance sensing circuit (potential divider, buffer circuit, and 12-bit ADC) can be performed.

Graph 300 compares two textile sensors: with and without melting yarn and heat treatment or thermoforming. The untreated case is represented by lines 302, whereas the treated case is represented by lines 304. As can be seen, without thermoforming, there is a significant hysteresis response (spacing between lines 302 along vertical axis, representing resistance) when the sensor is compressed and relaxed. This is because there are volume gaps and discontinuities between each layer, which can cause sensor drifts.

Figure 3B:
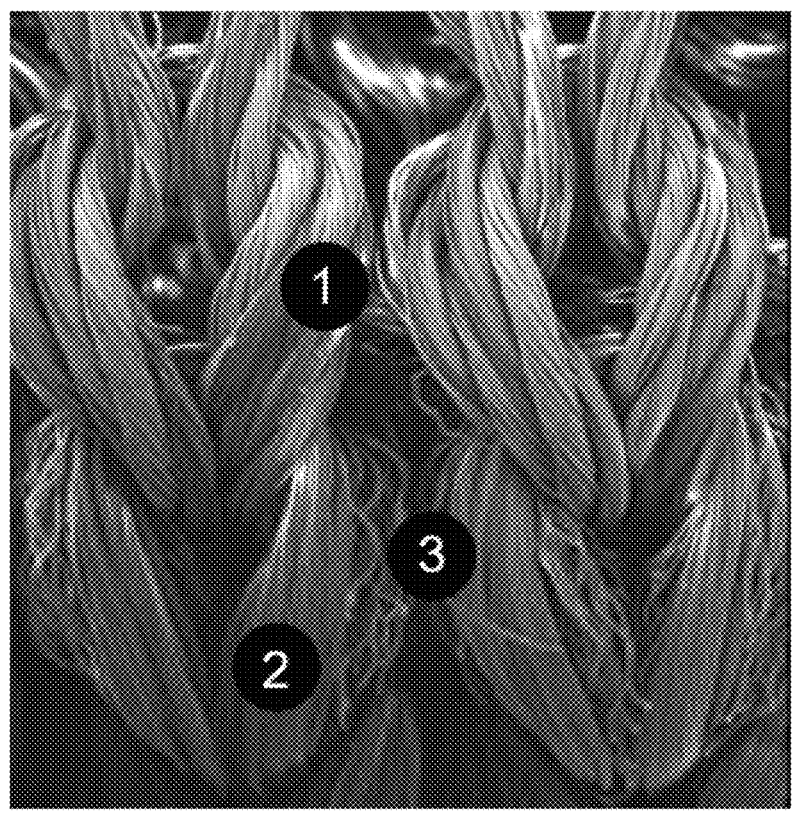
FIGS. 3B and 3C are surface electron microscopy (SEM) images of a knit structure and surface before and after thermoforming.
Figure 3C:
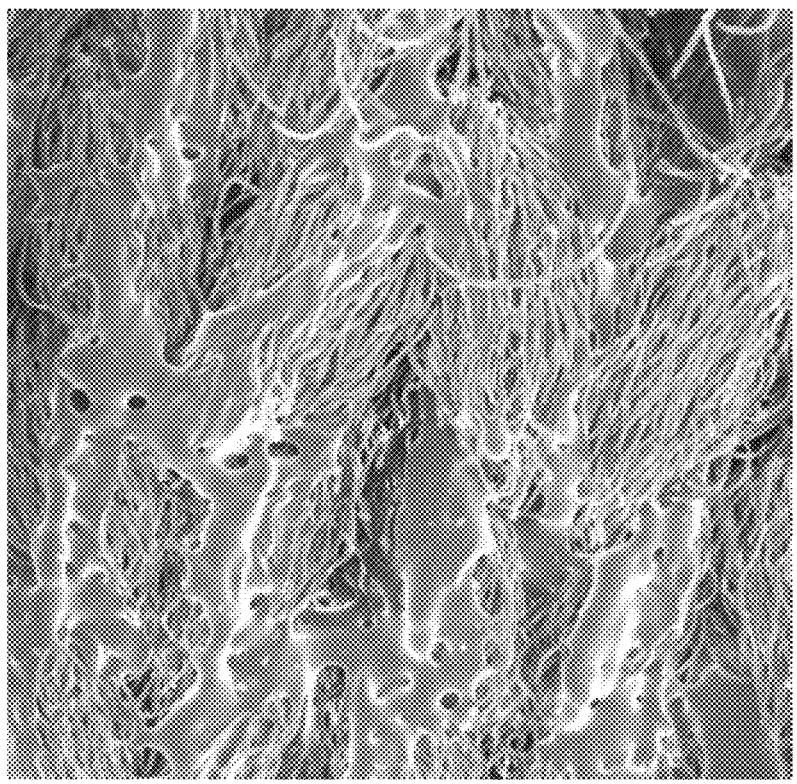

FIG. 3B is a surface electron microscopy (SEM) image of a knit structure and surface before thermoforming. The illustrative knit structure comprises silver-coated yarns 1, polyester yarns 2, and TPU melting fibers 3. FIG. 3C is a SEM image of the same knit structure and surface after thermoforming. This shows adhesion from the melted TPU.

Figure 3D:
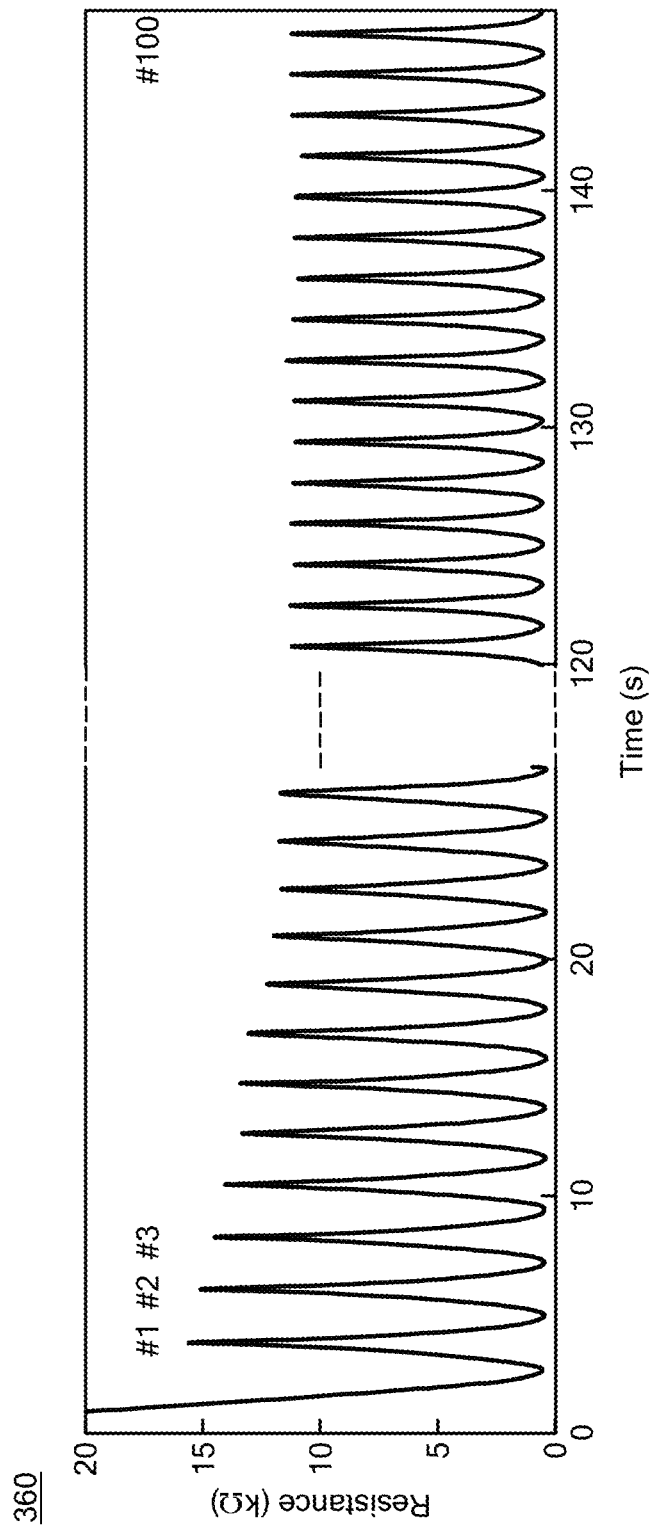
FIG. 3D is a graph of repeatability, from cyclic test results showing the robustness of the thermoformed piezoresistive knit textile provided according to the present disclosure.

Referring to FIG. 3D, graph 360 plots the results of a repeatability, cyclic test, showing the robustness of thermoformed piezoresistive knit textile, according to the present disclosure. This graph demonstrates reliable performance of a thermoformed knitted sensor, according to the present disclosure, during cyclic compression test (n=100), showing steady response after the 10th cycle.

Figure 4A:
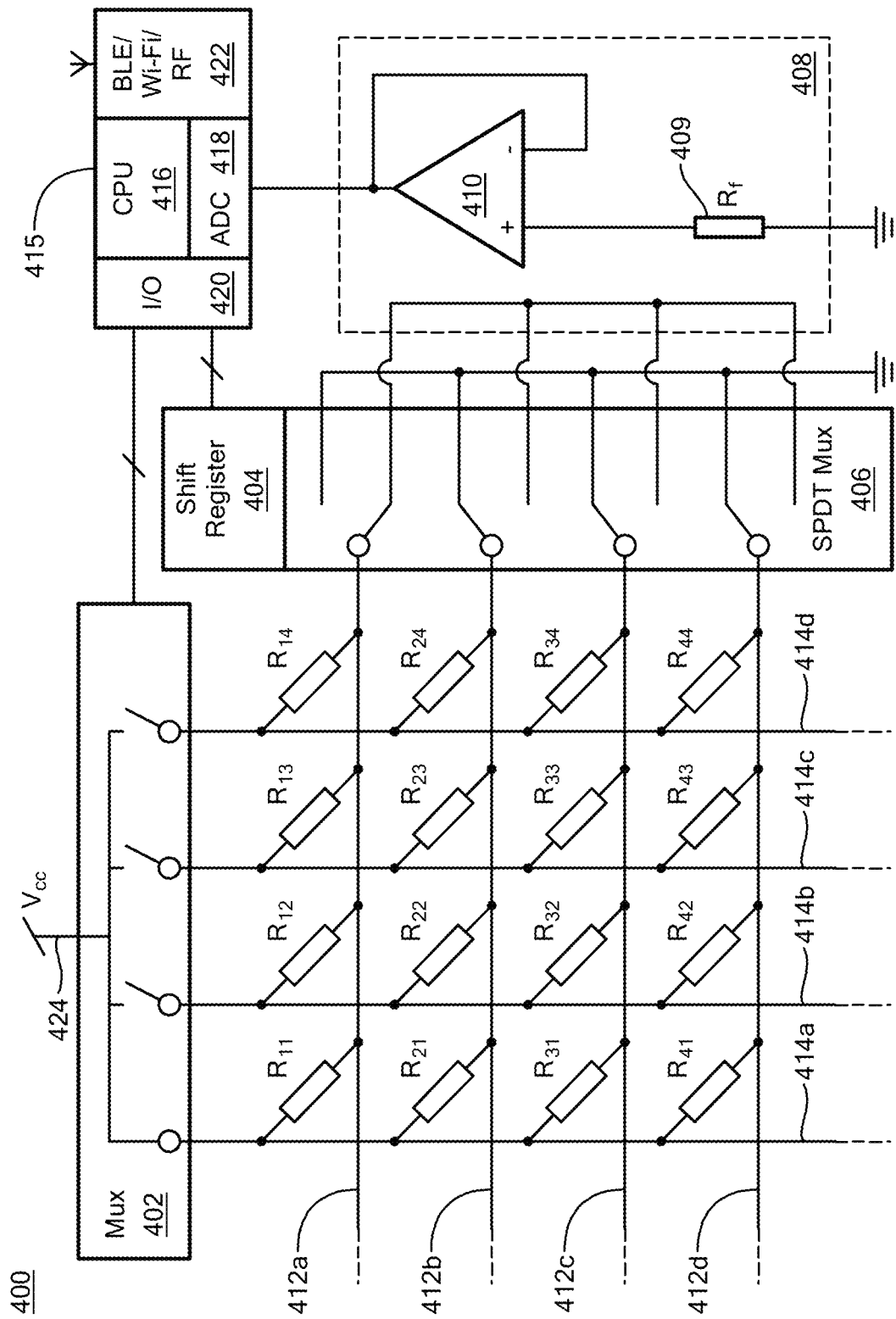
FIG. 4A is a schematic diagram of a processing system that may be connected to a pressure-sensitive textile, according to some embodiments.

Turning to FIG. 4A, with a row-column resistive sensor matrix (such as multi-layer structure 110 of FIG. 1B), a processing system is needed that can scan through each line to read the entire 2D pressure points. It is preferable that such a system should be robust to various sources of noises, including ghosting effects and neighboring crosstalk, which can influence the precision and accuracy of the readings.

FIG. 4A shows an example of a processing system 400 that may be connected to a pressure-sensitive textile, according to some embodiments. For example, processing system 400 may be the same as or similar to processing systems 104 and 108 of FIG. 1A. As shown, processing system 400 can include a radio for wireless data transfer and thus may be referred to as a wireless hardware system.

Processing system 400 includes a one or more multiplexers 402 (sometimes referred to as "analog multiplexers"), one or more shift-registers 404, one or more single-pole double-throw (SPDT) multiplexers 406, and a potential divider 408. The number of multiplexers, shift-registers, and SPDT multiplexes as well as the pin counts on each may be selected according to the dimensions of sensing matrix lines to be read. The general structures and techniques disclosed herein can be extended to various size matrixes. In some cases, multiple shift registers can be connected in series or "daisy chained" together. Likewise for multiple SPDT multiplexes. Potential (voltage) divider (or "resistive sensing circuit") 408 can include a reference resistor 409 ($R_f$) and a buffer op-amp 410, arranged as shown. A voltage divider like this exhibits a soft saturation that allows sensitivity at higher pressures, as opposed to using a current-sensing circuit (e.g., a transimpedance amplifier that would exhibit linear response and hard-saturate at high pressure), which is more conventionally used in such applications—as the voltage divider exhibits a finite impedance, the unused horizontal lines need to be grounded by the SPDT mux or shunted by low impedance loads to minimize crosstalk effects.

In some cases, multiplexer 402 may be provided as part CD74HCT4067 from Texas Instruments. In some cases, shift-registers 404 may be provided as part SN74LS595D from Texas Instruments. In some cases, SPDT multiplexers 406 may be provided as part ADG734BRUZ from Analog Devices. In some cases, buffer op-amp 410 may be provided as part TLV2371 from Texas Instruments. Other hardware solutions can also realize the functionality depicted in FIG. 4A—e.g., processors could be embedded with each 'patch' of fabric that use its pins to do the multiplexing and/or can be programmed for the shift register functionality.

Shift registers 404 may be provided on each of the SPDT multiplexer 406 for the purpose of opening or closing open the switches in succession (e.g., based on a digital clock signal generated by microcontroller 415). Using shift registers 404 for this purpose can allow for scaling the circuit for more matrix lines for a larger fabric without needing additional processors. However, in some implementations, shift-registers 404 may be omitted from the system and the corresponding functionality may be implemented by one or more processors or using another type of digital circuit.

In some cases, multiplexers 402 and/or SPDT multiplexers 406 may be replaced by a custom microprocessor, FPGA, or other relative advanced processing means (e.g., a means within microcontroller 415).

System 400 further includes a plurality of row lines 412a, 412b, 412c, 412d (412 generally) and a plurality of column lines 414a, 414, 414c, 414d (414 generally), whereby the row and column lines correspond to conductive paths (e.g., PCB traces). Each of the row lines 412 and column lines 414 can be connected to a different conductive line of an e-textile. For example, referring also to FIG. 1B, row lines 412 may connect to conductive lines 118 in outer layer 114 and column lines 414 may connect to orthogonal conductive lines 118 in outer layer 116. In more detail, and as shown, each row line 412 can have one end connected to a pin of a SPDT multiplexer 406, and the other end connected to an e-textile conductive line, whereas each column line 414 can have one end connected to pin of multiplexer 402 and the other end connected to an e-textile conductive line.

System 400 can further include a plurality of resistors $R_{11}$, $R_{12}$, etc. connecting (or "bridging") pairs of row lines 412 and column lines 414 as shown.

While FIG. 4A shows a 4×4 arrangement of rows and columns, other numbers or rows and columns can be provided. The number of pins provided by multiplexer 402, shift-registers 404, and/or SPDT multiplexers 406 may be adjusted accordingly.

Processing system 400 further includes a microcontroller 415 comprising a central processing unit (CPU) 416, an analog-to-digital converter (ADC) 418, an I/O subsystem 420, and a radio 422 for wireless control and data transfer. In some embodiments, microcontroller 415 may alternatively or additionally include an interface for wired control and data transfer, such as a Serial-USB interface. In some cases, CPU 416 may be provided as a 64 MHz ARM Cortex M4F or 180 MHz ARM Cortex-M4 from Nordic Semiconductor. In some cases, radio 422 may be provided as a Bluetooth low energy (BLE) module.

CPU 416 can control multiplexer 402 to switch a voltage supply 424 periodically to each column line 414, while putting the rest on high impedance. CPU 416 can also control SPDT multiplexers 406 to provide a connection to the resistive sensing circuit 408 and ADC 418 pin on a row line 412 of interest while grounding the other row lines 412 sequentially. Using this technique, CPU 416 can sequentially scan each of N×M matrix lines to read out a total of N×M pressure sensing points. In more detail, for each of N×M pressure sensing points in an e-textile, CPU 416 can obtain a value that is proportional to pressure exerted at that point. CPU 416 may transfer the obtained pressure sensor data to a remote processing system wirelessly using radio 422 and/or via a wired connect (e.g., Serial-USB). Segments of pressure-imaging textile composed of N columns and M rows can each be managed by separate circuitry, either having their own microprocessors (which can be networked together to output detected pressure) or using shift registers to sequentially drive the multiplexers (in which case they can share an analog output that is routed to a central processor).

Various scanning and data transfer frequencies can be achieved depending on the capabilities of microcontroller and, more particularly, of CPU 416 and radio 422.

Figure 4B:
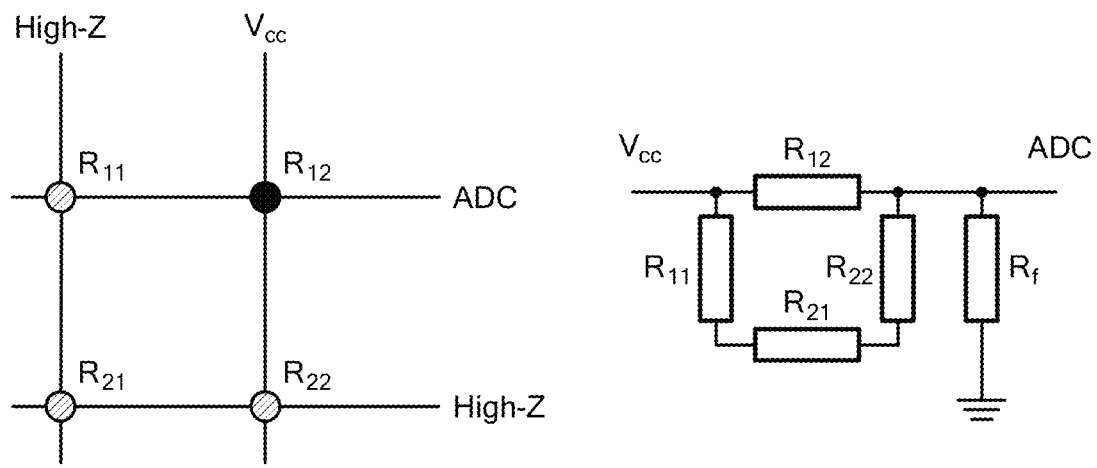
FIGS. 4B-4D show models reflecting conventional resistive sensing array read-out circuit configurations.
Figure 4C:
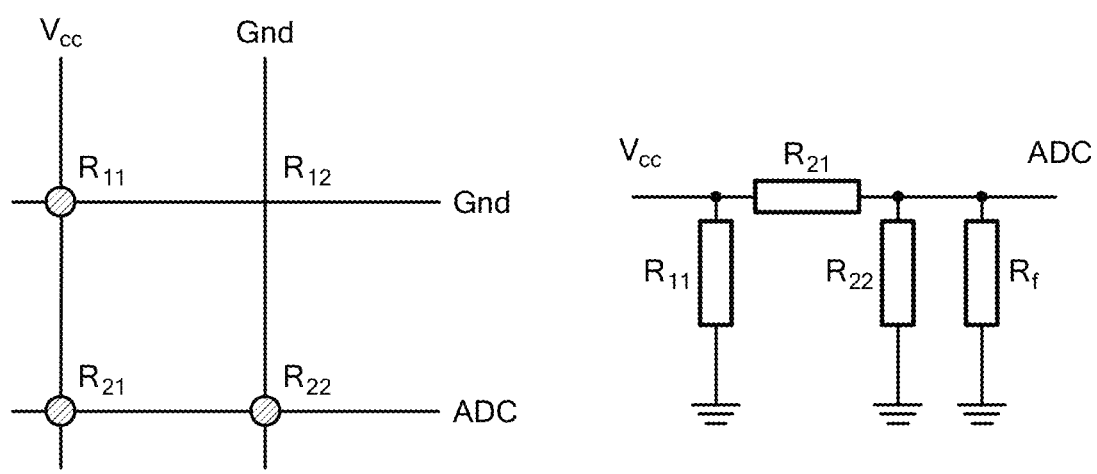
Figure 4D:
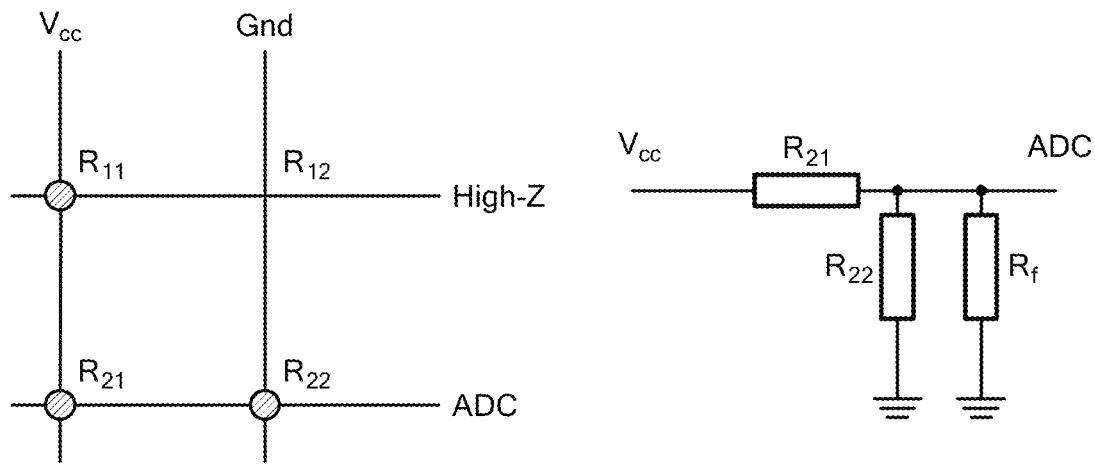
Figure 4E:
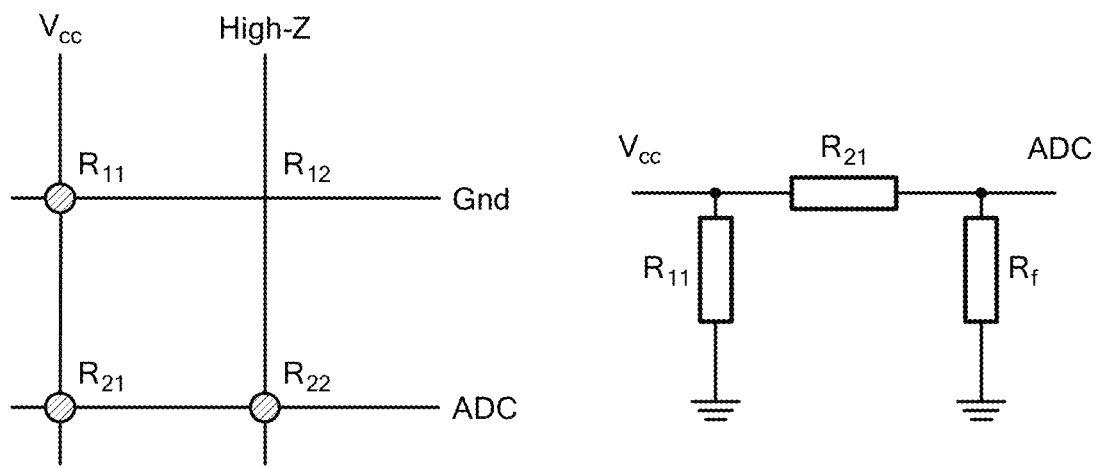
FIG. 4E shows a model reflecting the improved resistive sensing array read-out circuit configuration embodied by the processing system of FIG. 4A to reduce/minimize ghosting and crosstalk from neighboring nodes and multi-pressure points, according to some embodiments.

Turning to FIGS. 4B-E, the scanning technique described above solves ghosting and crosstalk issues apparent in most resistive sensing array read-out circuits. If high-impedance is applied to the rest of the row-column pins, as illustrated in FIG. 4B, the appearance of ghosting effect is seen in the sensor point Ria due to the bridging connection between $R_{11}$, $R_{21}$, and $R_{22}$. Suppose a reading is to be taken at sensor point $R_{21}$. In the case of switching configuration in FIGS. 4C and 4D, crosstalk from sensor points $R_{11}$+$R_{22}$ and $R_{22}$ respectively will influence $R_{21}$ readout. In contrast, with circuit configuration FIG. 4E—which corresponds to the scanning technique described above in the context of FIG. 4A—no connection exists from $R_{22}$ or $R_{12}$ and $R_{11}$ will not interfere with the potential divider circuits and ADC readings as it is connected to the ground.

In some embodiments, processing system 400 can be provided as a printed circuit board (PCB) design with dimensions sufficiently small to be attached to a wearable surface. In some cases, a PCB can be provided as an extension or a shield so that the main microcontroller and wireless/wired communication means can be more easily replaced.

Figure 5A:
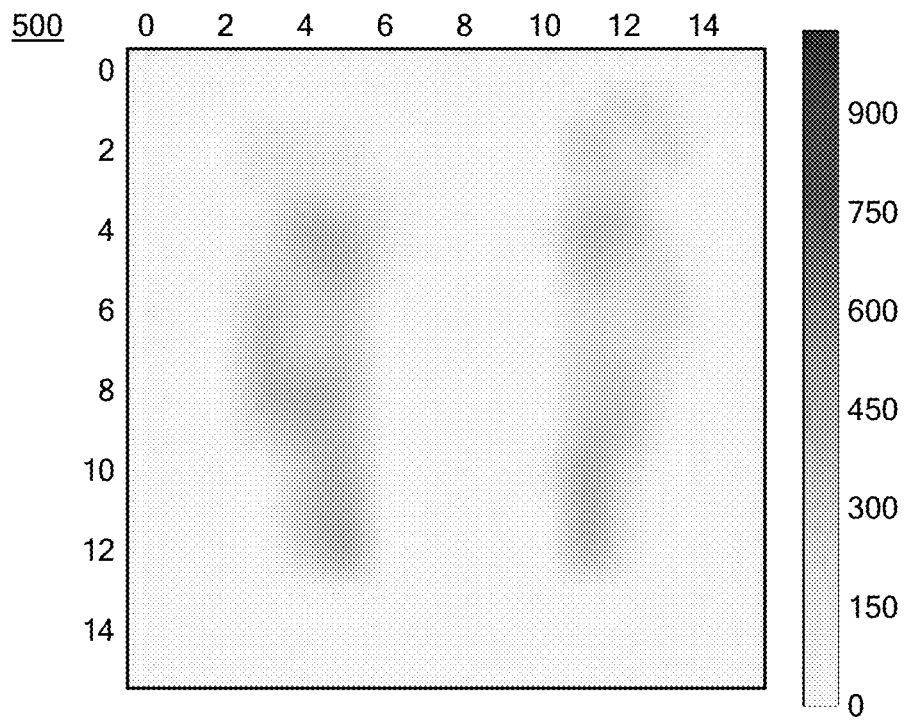
FIGS. 5A, 5B, 6A, and 6B show examples of pressure "heat-maps" that may be generated during activities and exercises.
Figure 5B:
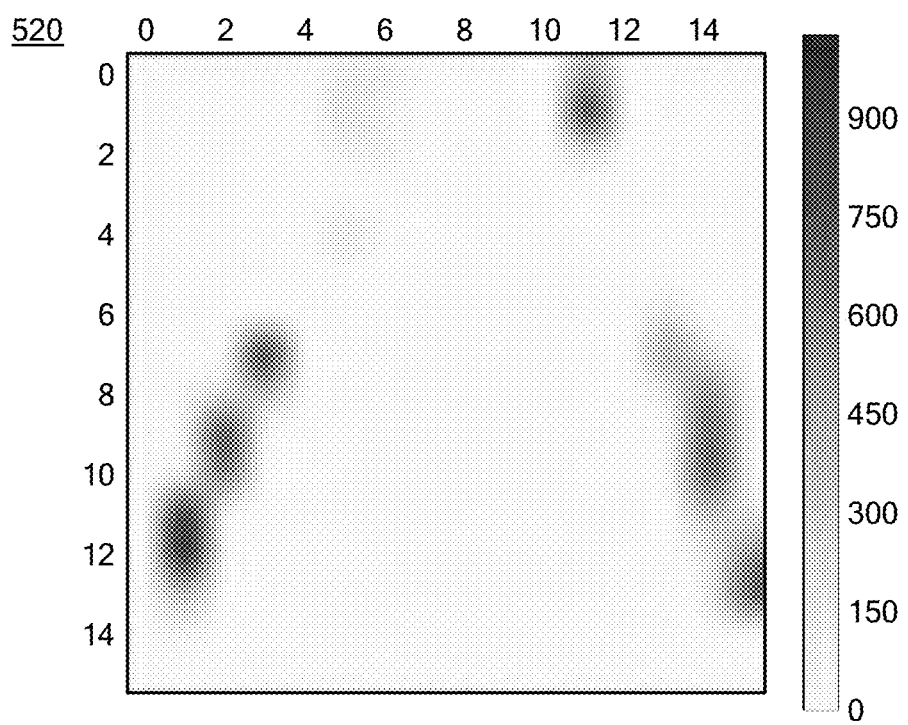
Figure 6A:
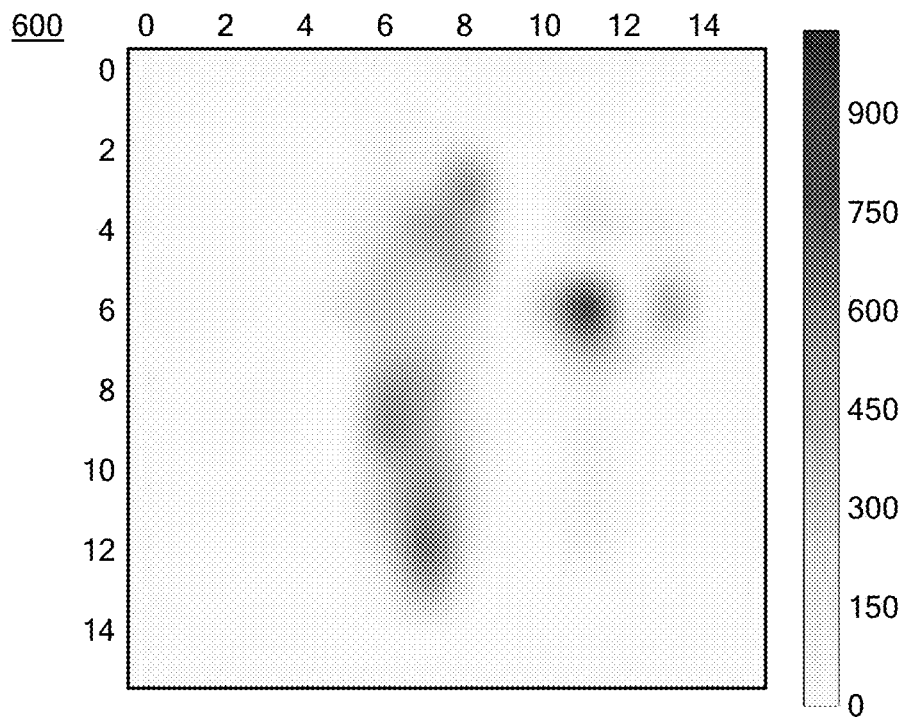
Figure 6B:
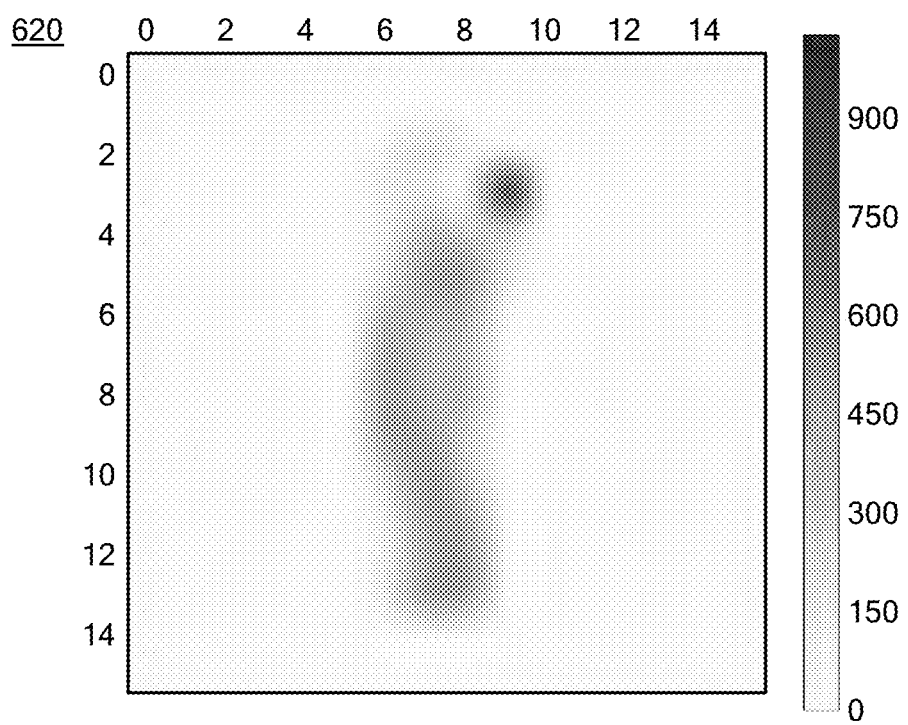

As discussed, processing system 400 can obtain and transmit N×M arrays of pressure sensor data at high frequency. This data can be understood and visualized in the form of pressure "heat-maps." FIGS. 5A, 5B, 6A, and 6B show examples of heat-maps that may be generated in response to a person performing activities and exercises on an e-textile mat, such as yoga mat 102 of FIG. 1A. In FIG. 5A, heat-map 500 corresponds to the person standing. In FIG. 5B, heat-map 520 corresponds to the person performing a plank. In FIG. 6A, heat-map 600 corresponds to the person in a yoga tree pose (yoga). In FIG. 6B, heat-map 520 corresponds to the person in an eagle pose (yoga).

Figure 7A:
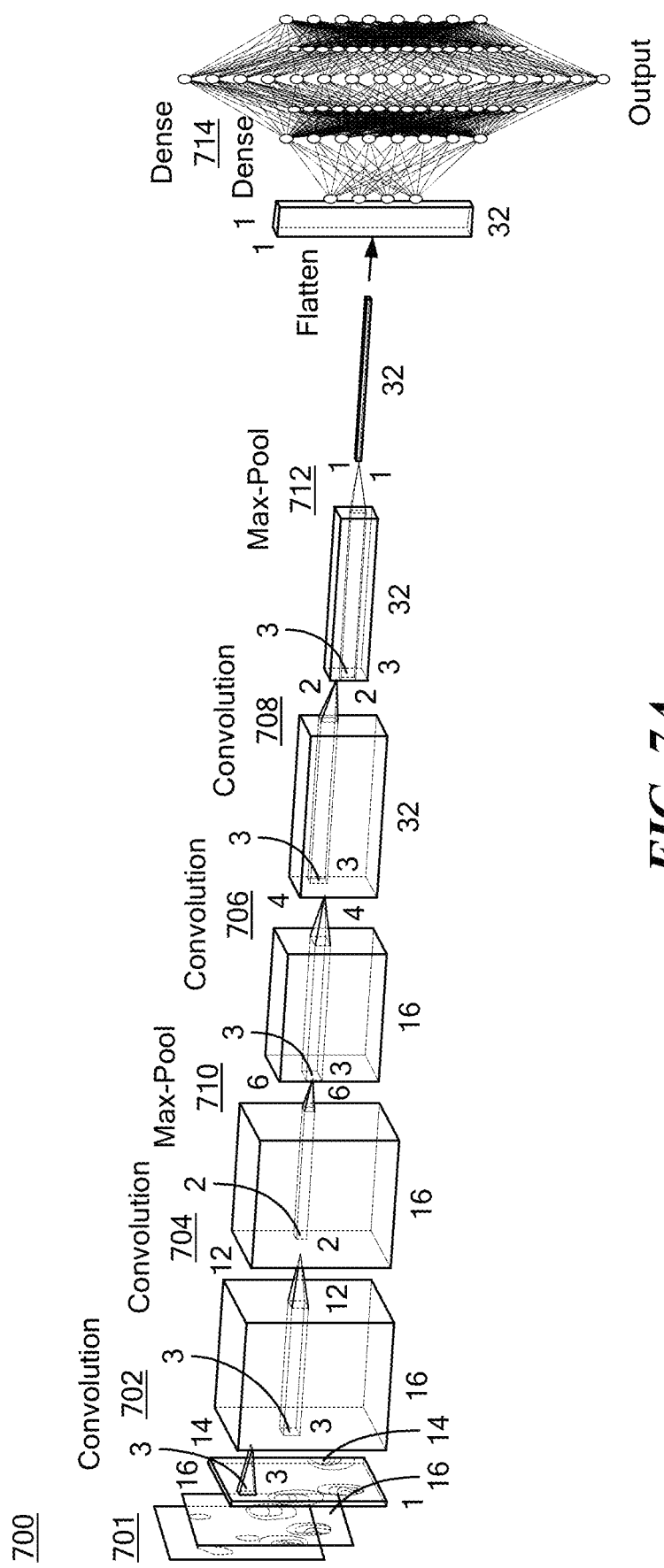
FIG. 7A is a schematic diagram showing an example of a convolutional neural network (CNN) that can be used for recognizing activities and exercises based on such heat-maps, according to some embodiments.

Turning to FIG. 7A, as a person balances and redirects their center of mass through their feet, they exert force on the grounds. By detecting the pressure distribution of the feet using a disclosed e-textile mat (e.g., yoga mat 102 of FIG. 1A), rich contextual information about our posture and activities can be extracted. Such information can be used in a variety of application scenarios, including but not limited to: an intelligent mat connected to a virtual environment in order to gamify exercise and motivate users to move their body and play, and a real-time yoga posture recognition for balance training purposes.

According to some embodiments, deep learning can be used to analyze pressure sensor data obtained using the structures and techniques disclosed herein for activity recognition and biomechanical monitoring, among other applications. In more detail, spatiotemporal 2D pressure sensor data (heat-maps) can be treated as image frames (i.e., 2D array of pixels) and provided as input to a convolutional neural network (CNN) for training and classification. CNNs have been demonstrated to achieve high accuracy for human activity recognition in comparison with other methodologies such as KNN, SVM, Extra Trees, or Random Forest.

FIG. 7A shows an example of a CNN 700 that can be used for recognizing activities and exercises based on heat-maps, according to some embodiments. The illustrative CNN 700 takes an image (2D array of pixels) as input 701 and comprises four convolutional layers 702, 704, 706, 708 (Conv2D) and two Max-Pooling layers 710, 712. For each convolutional layer 702, 704, 706, 708, there are 16 to 32 filters that use nine weights M, each to transform a pixel to a weighted average of itself and its eight neighbors. As the same nine weights are used over the whole image, the network will pick up features that are useful everywhere. The Max-Pooling layers 710, 723 look at four neighboring pixels and pick a maximal value. They reduce the size of the image by half. By combining convolutional and pooling layers, network 700 is able to learn more global features of the image. At the output, the CNN 700 includes two fully connected (Dense) layers in which the features are used.

To improve training time and Dropout, Batch Normalization may be employed, where the layer randomly replaces a proportion of its weights to zero for each training sample. This forces the network to learn features in a distributed way, not rely on a particular weight, and improve generalization.

The particular selection and arrangement of network layers illustrated in FIG. 7A are merely illustrative and other architectures may be used. As one example, a CNN can additionally or alternatively include two Conv2D layers with sixteen filters and ReLU activation, two Conv2D layers with thirty-two filters and ReLU activation, four Batch Normalization layers, two Max-Pooling layers, four Dropout layers (three with Dropout of 0.25 and one with Dropout of 0.5), two Dense layers with ReLU activation, and a final Dense layer with softmax activation.

In some embodiments, CNN 700 may be implemented and utilized in a processing system that is remote from the sensorized e-textile. The spatiotemporal pressure data can be recorded and transmitted to the processing system that is local to the e-textile.

Figure 7B:
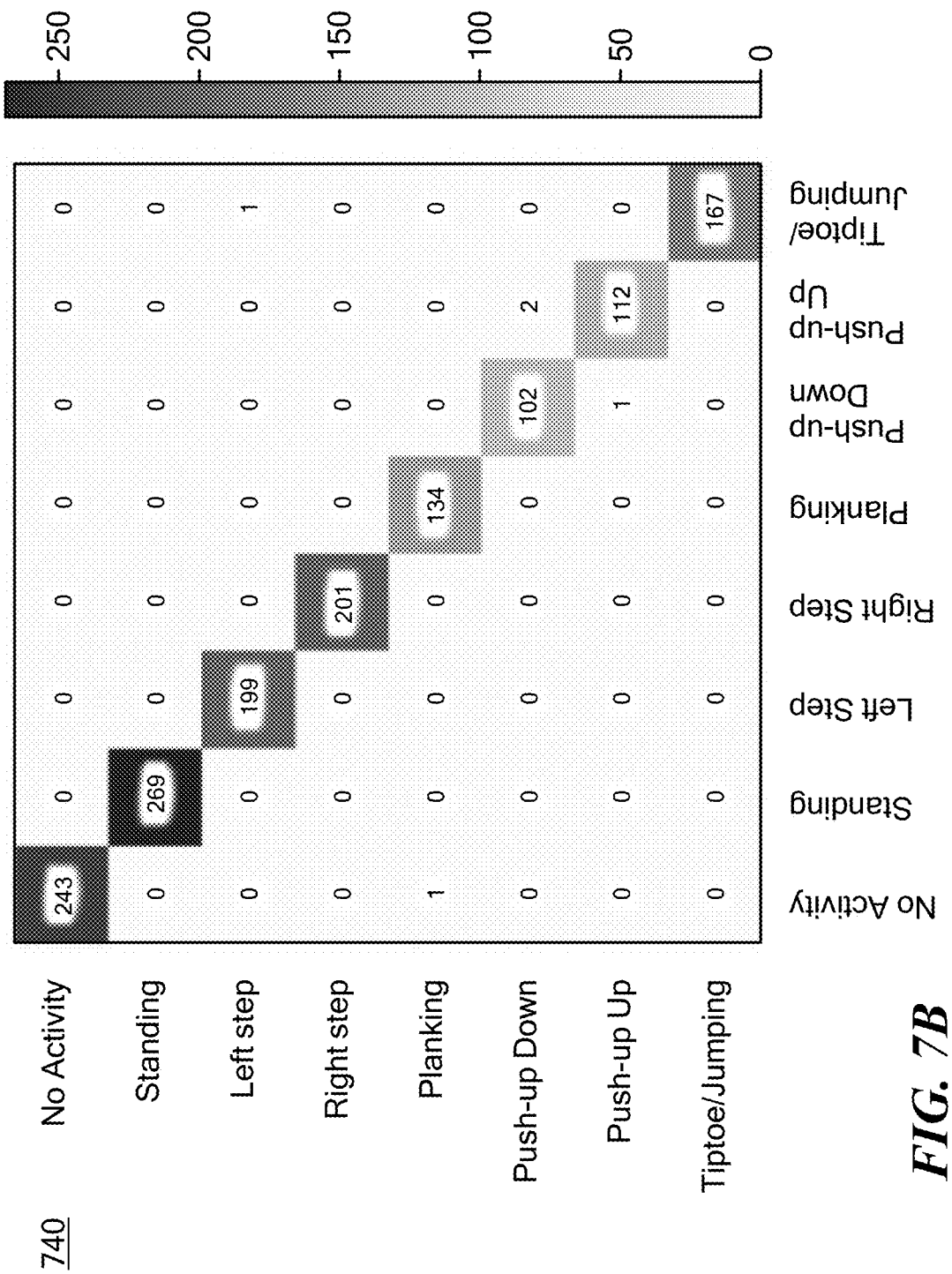
FIGS. 7B and 7C show examples of confusion matrixes that may be used in classifying activities and exercises, according to some embodiments.
Figure 7C:
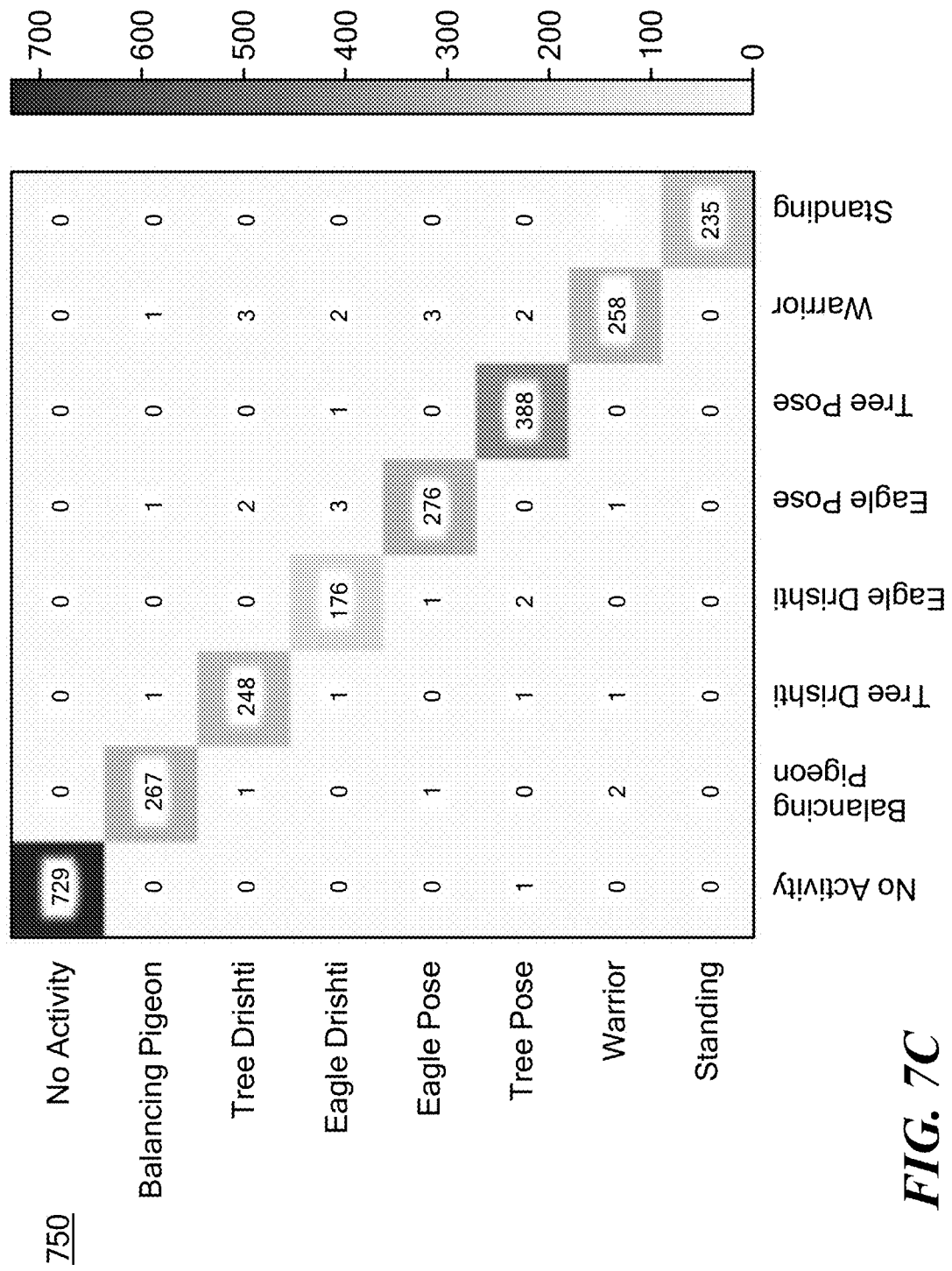

FIGS. 7B and 7C are confusion matrices illustrating how the deep learning techniques disclosed herein can accurately classify both activity (matrix 740 FIG. 7B) and yoga posture (matrix 750 of FIG. 7C). As shown, disclosed CNN models can be used to classify activities and poses using our mat with high accuracy of around 99.6% and 98.7%, respectively.

The structures and techniques disclosed herein can also be used to infer transient activities such as walking, running, and jumping. For example, with data obtained from a knitted intelligent textile mat, a sliding window algorithm can be applied on top of classification results to infer such transient activities. For instance, if the position of a left foot on the mat is detected and the position of a right foot on the mat is detected, it can be inferred whether a user is standing, walking, or running by checking for alternating left and right feet in a window of time, or similarly detecting sequences of standing, tiptoe, and no activity or jumping events. In some cases, recognition results can be used and interfaced to control video games, for example in order to gamify exercise.

Figure 8:
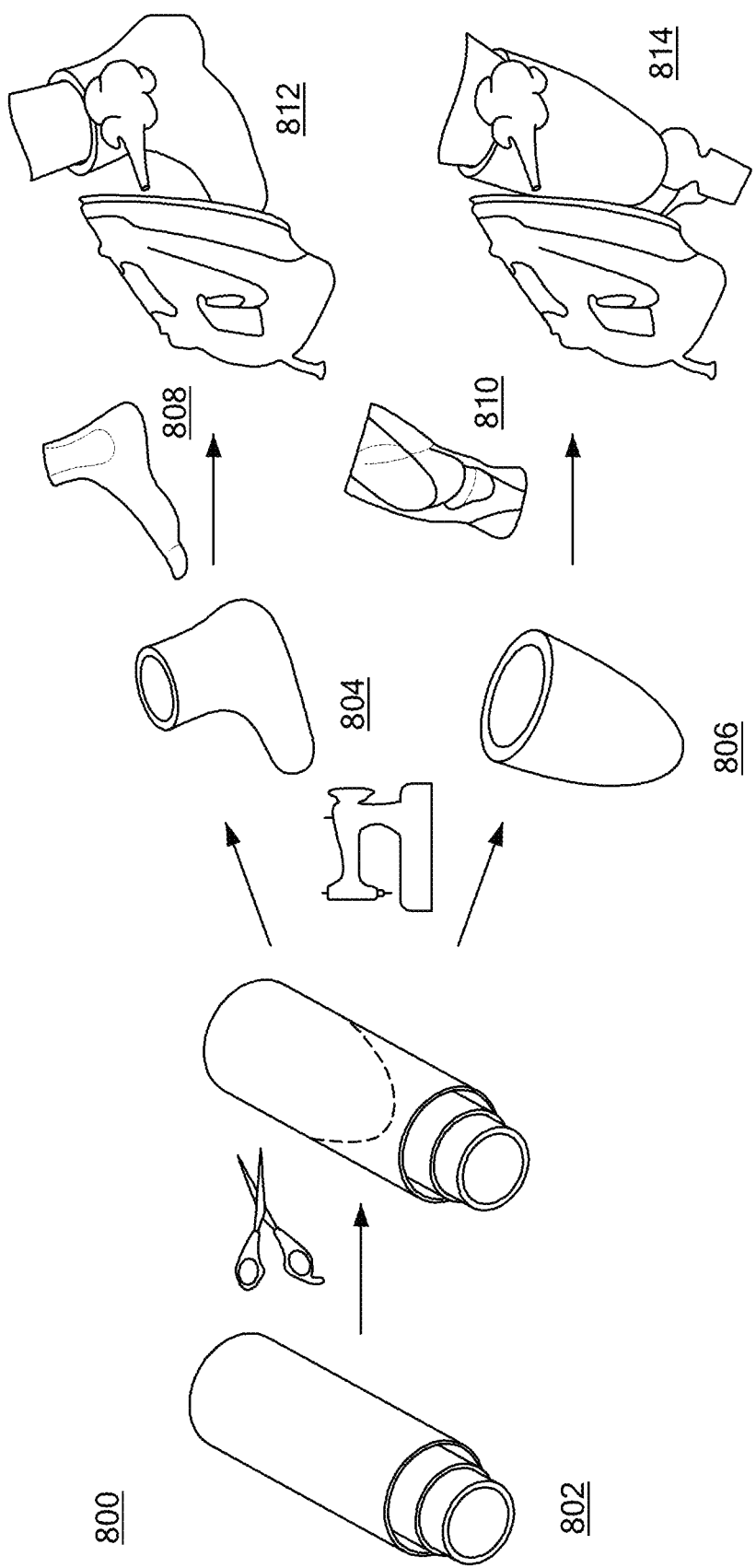
FIG. 8 shows a process for 3D shaping and thermoforming of tubular knitted e-textiles, according to some embodiments.

FIG. 8 illustrates a process for 3D shaping and thermoforming of tubular knitted e-textiles for an intelligent shoe or prosthetic lining and socket, according to some embodiments.

A tubular knit textile 802 can be developed using a digital circular knitting machine and a combination of polyester, spandex, conductive, and TPU yarns in the knitting process. Such a machine can increase productivity because the relatively slow reciprocating motion of flat knit machines is replaced by a continuous and faster circular motion. The tubular knitted textile can be designed to have an intersecting conductive-striped pattern, in a manner similar to that shown in FIG. 1B for a flat-knit textile. The textile 802 may be cut into pieces that are sewn together to make various tubular garments, such as socks, shoes, sleeves, underwear or t-shirts. In this example, textile 802 can be used to make a sock 804 and a prosthetic lining 806.

In some cases, sensing apparel such as a sock may be produced directly using 3D knitting without requiring the cutting shown in FIG. 8. Thus, for example, process 800 may begin by directly 3D knitting sock 804 or prosthetic lining 806.

To develop form-fitting apparel customized to a user, 3D-scanning of the human body can be performed to create a 3D-printed model 808, 810 of the arms or extremities for prosthetic design. Alternatively, in the case of footwear design, a shoe known to closely fit the user may be scanned. The garments 804, 806 can then be fit over the 3D-printed models 808, 810 and heat can be applied to produce form-fitting apparel 812, 814 customized to the user.

The structures and techniques disclosed herein can be used to develop our 3D knitted sensing apparel such as shoes and socks. For example, a sensorized shoe/sock can be developed for interactive gait, biomechanics, and football (soccer) sensing. While certain embodiments are described herein in terms of certain human-worn textiles (e.g., socks, shoes, etc.), the structures and techniques to be protected can be applied to a wide range of e-textiles used on both human and non-human subjects. For example, the disclosed techniques can be used to create form-fitting sensorized coverings for robotics, exercise equipment, etc.

As used herein, the terms "processor" and "controller" are used to describe electronic circuitry that performs a function, an operation, or a sequence of operations. The function, operation, or sequence of operations can be hard coded into the electronic circuit or soft coded by way of instructions held in a memory device. The function, operation, or sequence of operations can be performed using digital values or using analog signals. In some embodiments, the processor or controller can be embodied in an application-specific integrated circuit (ASIC), which can be an analog ASIC or a digital ASIC, in a microprocessor with associated program memory and/or in a discrete electronic circuit, which can be analog or digital. A processor or controller can contain internal processors or modules that perform portions of the function, operation, or sequence of operations. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

Various embodiments of the concepts, systems, devices, structures and techniques sought to be protected are described herein with reference to the related drawings. Alternative embodiments can be devised without departing from the scope of the concepts, systems, devices, structures and techniques described herein. It is noted that various connections and positional relationships (e.g., over, below, adjacent, etc.) are set forth between elements in the following description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

In the foregoing detailed description, various features are grouped together in one or more individual embodiments for the purpose of streamlining the disclosure. This method of disclosure is not to be interpreted as reflecting an intention that each claim requires more features than are expressly recited therein. Rather, inventive aspects may lie in less than all features of each disclosed embodiment.

References in the disclosure to "one embodiment," "an embodiment," "some embodiments," or variants of such phrases indicate that the embodiment(s) described can include a particular feature, structure, or characteristic, but every embodiment can include the particular feature, structure, or characteristic. Moreover, such phrases are not necessarily referring to the same embodiment(s). Further, when a particular feature, structure, or characteristic is described in connection knowledge of one skilled in the art to affect such feature, structure, or characteristic in connection with other embodiments whether or not explicitly described.

The disclosed subject matter is not limited in its application to the details of construction and to the arrangements of the components set forth in the following description or illustrated in the drawings. The disclosed subject matter is capable of other embodiments and of being practiced and carried out in various ways. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

All publications and references cited herein are expressly incorporated herein by reference in their entirety.

The invention claimed is:

1. A system for use with a knitted textile having a plurality of pressure sensing points, the system comprising:
a plurality of column lines connected to the textile and a first multiplexer;
a plurality of row lines connected to the textile and a second multiplexer; and
one or more digital circuits configured to:
control the first multiplexer to periodically switch a voltage supply to each of the plurality of column lines while putting the rest of the column lines on high-impedance,
control the second multiplexer to sequentially connect to ones of the plurality of row lines to a potential divider while grounding the other row lines for reading out values of the plurality of pressure sensing points, and
provide the values of the plurality of pressure sensing points to a processing system configured to generate one or more pressure distributions based on the values of the plurality of pressure sensing points and to recognize activities of a wearer of the knitted textile based on the pressure distributions and using machine learning (ML).

2. The system of claim 1 wherein the one or more digital circuits comprise a shift register arranged to control the second multiplexer.

3. The system of claim 1 wherein the one or more digital circuits comprise a processor configured to control the first multiplexer.

4. The system of claim 3 wherein the processor is further configured to wirelessly transmit the values of the plurality of pressure sensing points to a remote the processing system.

5. The system of claim 1 wherein the pressure distributions are images having 2D arrays of pixels, wherein the processing system is configured to recognize the activities of the wearer by providing the images as input to a Convolutional Neural Network (CNN) trained to classify human activities.

6. The system of claim 1 comprising the processing system.

* * * * *